US012763154B2

(12) United States Patent
Kim et al.

(10) Patent No.: US 12,763,154 B2
(45) Date of Patent: Oct. 13, 2026

(54) MEMORY DEVICE, MEMORY SYSTEM, AND OPERATING METHOD OF MEMORY DEVICE

(71) Applicant: Samsung Electronics Co., Ltd., Suwon-si (KR)

(72) Inventors: Tongsung Kim, Suwon-si (KR); Seonkyoo Lee, Suwon-si (KR); Younggyu Lee, Suwon-si (KR); Taesung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 47 days.

(21) Appl. No.: 18/932,736

(22) Filed: Oct. 31, 2024

(65) Prior Publication Data

US 2025/0095755 A1 Mar. 20, 2025

Related U.S. Application Data

(63) Continuation-in-part of application No. 18/804,617, filed on Aug. 14, 2024.

(30) Foreign Application Priority Data

Sep. 19, 2023 (KR) ........................ 10-2023-0125001
Sep. 6, 2024 (KR) ........................ 10-2024-0121778

(51) Int. Cl.
*G11C 16/32* (2006.01)
*G11C 16/04* (2006.01)
*G11C 29/02* (2006.01)

(52) U.S. Cl.
CPC .......... *G11C 16/32* (2013.01); *G11C 16/0483* (2013.01); *G11C 29/023* (2013.01)

(58) Field of Classification Search
CPC .... G11C 16/32; G11C 16/0483; G11C 29/023
(Continued)

(56) References Cited

U.S. PATENT DOCUMENTS 8,610,475 B2 12/2013 Kim et al.
8,644,085 B2 2/2014 Kim et al.
(Continued)

FOREIGN PATENT DOCUMENTS

CN 116073802 A 5/2023

OTHER PUBLICATIONS

Extended European Search Report corresponding to EP 24201374.6, Feb. 25, 2025, 8 pp.

*Primary Examiner* — Fernando Hidalgo
(74) *Attorney, Agent, or Firm* — Wolf, Greenfield & Sacks, P.C.

(57) ABSTRACT

Provided is a memory device including a first pad configured to receive a read enable signal from a memory controller, a second pad configured to receive a read duty cycle correct command signal from the memory controller, a first duty correction circuit configured to perform a read duty cycle correct operation, based on the read duty cycle correct command signal received from the memory controller, when the read enable signal is received, and output a data strobe signal generated based on the read duty cycle correct operation, and a second duty correction circuit configured to receive the data strobe signal from the first duty correction circuit, generate first to fourth clock signals having different phases from each other based on the data strobe signal, and perform a write duty cycle correct operation to correct a duty cycle for the first clock signal and the third clock signal which have a phase difference of 180° and to correct a duty cycle for the second clock signal and the fourth clock signal which have a phase difference of 180°, wherein the read duty
(Continued)

cycle correct operation and the write duty cycle correct operation are performed simultaneously.

20 Claims, 17 Drawing Sheets

(58) Field of Classification Search
USPC .......................................................... 365/191
See application file for complete search history.

(56) References Cited

U.S. PATENT DOCUMENTS

| | | | |
|---|---|---|---|
| 11,244,711 | B2 | 2/2022 | Tsuji |
| 11,257,531 | B2 | 2/2022 | Park et al. |
| 11,461,176 | B2 | 10/2022 | Park et al. |
| 2020/0059226 | A1 | 2/2020 | Choi et al. |
| 2021/0358534 | A1 | 11/2021 | Choi et al. |
| 2022/0230666 | A1 | 7/2022 | Kim et al. |
| 2023/0079802 | A1* | 3/2023 | Nakata ................ G11C 7/1066 327/175 |
| 2023/0113204 | A1 | 4/2023 | Lee et al. |
| 2023/0118731 | A1 | 4/2023 | Balasubrahmanyam et al. |

* cited by examiner

MEMORY DEVICE, MEMORY SYSTEM, AND OPERATING METHOD OF MEMORY DEVICE

CROSS-REFERENCE TO RELATED APPLICATIONS

This application is a continuation-in-part of U.S. patent application Ser. No. 18/804,617, filed Aug. 14, 2024, which is based on and claims priority under 35 U.S.C. § 119 to Korean Patent Application No. 10-2023-0125001, filed Sep. 19, 2023, and further claims priority to Korean Patent Application No. 10-2024-0121778, filed Sep. 6, 2024, in the Korean Intellectual Property Office, the disclosures of which are incorporated by reference herein in their entireties.

BACKGROUND

The inventive concept relates to a memory device, a memory system, and an operating method of the memory device, and more particularly, to a memory device configured to perform a read duty cycle correct operation and a write duty cycle correct operation, a memory system, and an operating method of the memory device.

Memory devices in the related art have typically performed only correction of a data strobe signal for a read signal whereas recently developed memory devices also perform correction of a data strobe signal for a write signal.

That is, the recently developed memory devices perform read duty cycle correct training (RDCC) and write duty cycle correct training (WDCC) to prevent or reduce occurrences of issues during a read operation or a write operation.

SUMMARY

When performing read duty cycle correct training and write duty cycle correct training, as a memory device performs the read duty cycle correct training and the write duty cycle correct training based on different signals from each other, such read duty cycle correct training and write duty cycle correct training may require a significant amount of time.

The inventive concept provides a memory device configured to perform write duty cycle correct training by using a signal generated based on a signal used in read duty cycle correct training.

According to an aspect of the inventive concept, there is provided a memory device including a first pad configured to receive a read enable signal from a memory controller, a second pad configured to receive a read duty cycle correct command signal from the memory controller, a first duty correction circuit configured to perform a read duty cycle correct operation, based on the read duty cycle correct command signal received from the memory controller, when the read enable signal is received, and output a data strobe signal generated based on the read duty cycle correct operation, and a second duty correction circuit configured to receive the data strobe signal from the first duty correction circuit, generate first to fourth clock signals having different phases from each other based on the data strobe signal, and perform a write duty cycle correct operation to correct a duty cycle for the first clock signal and the third clock signal which have a phase difference of 180° and to correct a duty cycle for the second clock signal and the fourth clock signal which have a phase difference of 180°, wherein the read duty cycle correct operation and the write duty cycle correct operation are performed simultaneously.

According to another aspect of the inventive concept, there is provided an operating method of a memory device, the operating method including receiving a read duty cycle correct command and a read enable signal from a memory controller, when the read enable signal is received, performing a read duty cycle correct operation, based on the read duty cycle correct command, and outputting a data strobe signal, based on the read duty cycle correct operation, receiving the data strobe signal and generating first to fourth clock signals having different phases from each other based on the data strobe signal, and performing a write duty cycle correct operation to correct a duty cycle for the first to fourth clock signals, wherein the read duty cycle correct operation and the write duty cycle correct operation are performed simultaneously.

According to another aspect of the inventive concept, there is provided a memory system including a memory controller configured to generate a read duty cycle correct command and a read enable signal, and a memory device configured to perform a training operation with respect to a read signal and a write signal, wherein the memory device includes a first pad configured to receive the read enable signal from the memory controller, a second pad configured to receive a read duty cycle correct command signal, a first duty correction circuit configured to perform a read duty cycle correct operation, based on the read duty cycle correct command signal received from the memory controller, when the read enable signal is received, and output a data strobe signal, based on the read duty cycle correct operation, and a second duty correction circuit configured to receive the data strobe signal from the first duty correction circuit, generate first to fourth clock signals having different phases from each other based on the data strobe signal, and perform a write duty cycle correct operation to correct a duty cycle for the first to fourth clock signals, wherein the read duty cycle correct operation and the write duty cycle correct operation are performed simultaneously.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
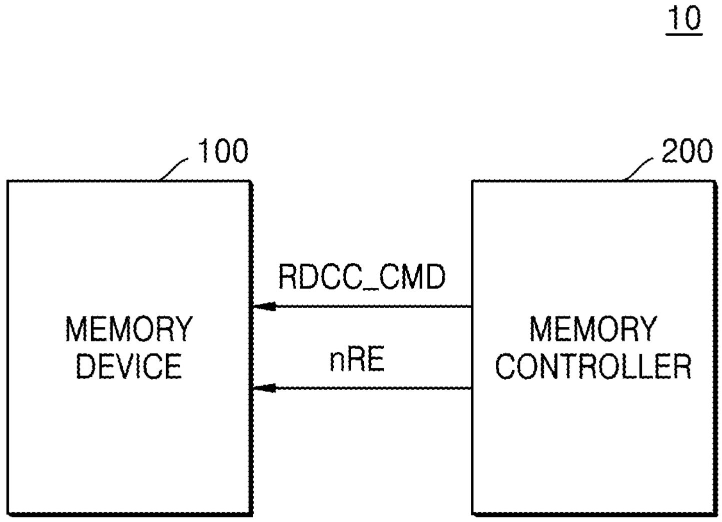
FIG. 1 is a block diagram of a memory system according to an embodiment.

Hereinafter, embodiments of the inventive concept are described in detail with reference to the attached drawings. Provided are detailed configuration and structures of the embodiments to facilitate understanding of the inventive concept. Therefore, the embodiments provided below may be modified of changed in various ways without departing from the scope of the inventive concepts. Like reference numbers in the drawings indicate the same or similar functions throughout the various aspects. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a memory system 10 according to an embodiment.

Referring to FIG. 1, the memory system 10 according to an embodiment may include a memory device 100 and a memory controller 200.

The memory device 100 according to an embodiment may be configured to perform a training operation for a read signal and a write signal before a read operation or a write operation is performed. For example, the memory device 100 may perform a training operation for a read signal and a write signal by correcting a duty cycle of a data strobe signal.

The memory device 100 according to an embodiment may receive a read duty cycle correct command RDCC_CMD and a read enable signal nRE from the memory controller 200. For example, when read duty cycle correct training is performed in the memory device 100, the memory controller 200 may generate the read duty cycle correct command RDCC_CMD and the read enable signal nRE and transmit the generated read duty cycle correct command RDCC_CMD and the read enable signal nRE to the memory device 100. The read duty cycle correct operation according to an embodiment may be an operation of correcting a duty cycle of the read enable signal nRE when a training operation for the read signal is performed. In addition, the write duty cycle correct operation may be an operation of correcting a duty cycle of the data strobe signal when a training operation for the write signal is performed. As described below in relation to FIG. 2, the memory device 100 according to an embodiment may generate a data strobe signal based on the read enable signal nRE and perform a training operation for a write signal by using the generated data strobe signal to reduce time and power required for the duty cycle correct training operation.

Figure 2:
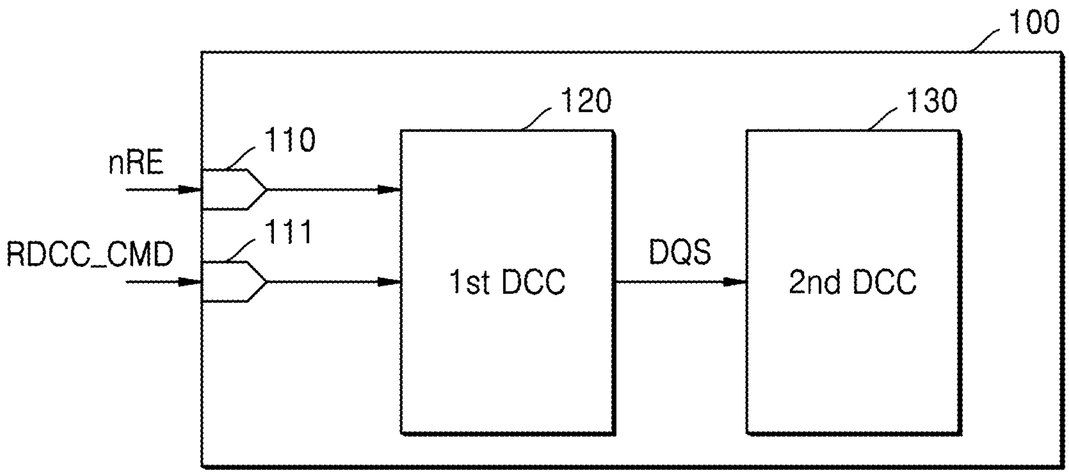
FIG. 2 is a block diagram of a memory device according to an embodiment.

FIG. 2 is a block diagram of the memory device 100 according to an embodiment.

Referring to FIG. 2, the memory device 100 according to an embodiment may include a first pad 110, a second pad 111, a first duty correction circuit 120, and a second duty correction circuit 130. In an embodiment, the memory device 100 may further include a third pad 131.

The first pad 110 according to an embodiment may receive the read enable signal nRE, and the second pad 111 may receive the read duty cycle correct command RDCC_CMD. For example, the first pad 110 may receive the read enable signal nRE, the second pad 111 may receive the read duty cycle correct command RDCC_CMD, and the received signals may be transmitted to the first duty correction circuit 120.

The third pad 131 according to an embodiment may output a data strobe signal DQS to the memory controller 200. For example, the third pad 131 may receive the data strobe signal DQS from the first duty correction circuit 120 and output the data strobe signal DQS to the memory controller 200. The third pad 131 may receive the data strobe signal DQS from the memory controller 200. For example, the third pad 131 may transmit the data strobe signal DQS received from the memory controller 200 to the second duty correction circuit 130.

The first duty correction circuit 120 according to an embodiment may receive the read duty cycle correct command RDCC_CMD and the read enable signal nRE from the memory controller 200 and may perform a read duty cycle correct operation based on the received read duty cycle correct command RDCC_CMD. For example, the first duty correction circuit 120 may correct the read enable signal nRE by performing the read duty cycle training operation and the read duty cycle correct operation based on the received read duty cycle correct command RDCC_CMD and output a data strobe signal DQS. Configuration of the first duty correction circuit 120 is described with reference to FIG. 3.

The second duty correction circuit 130 according to an embodiment may receive the data strobe signal DQS from the first duty correction circuit 120 and divide the received data strobe signal DQS. For example, the second duty correction circuit 130 may receive the data strobe signal DQS and divide the received data strobe signal DQS to generate a divided data strobe signal. The second duty correction circuit 130 according to an embodiment may divide the data strobe signal DQS received from the first duty correction circuit 120 based on preset criteria. The preset criteria according to which the data strobe signal DQS is divided according to an embodiment may adjust a duty interval by adjusting a cycle of the data strobe signal DQS. For example, the second duty correction circuit 130 may divide the data strobe signal DQS such that the cycle of the data strobe signal DQS received from the first duty correction circuit 120 is doubled. However, the preset criteria for dividing the received data strobe signal DQS are not limited thereto in accordance with various embodiments.

When the data strobe signal DQS is divided, the second duty correction circuit 130 according to an embodiment may correct a duty (e.g., an on-state period) between a first rising edge and a second falling edge of the divided data strobe signal and a duty between a first falling edge and the second falling edge of the divided data strobe signal. For example, the second duty correction circuit 130 may correct a duty between a phase of the divided data strobe signal of 0° and a phase of 180° and a duty between a phase of 90° and a phase of 270°. The second duty correction circuit 130 according to an embodiment may correct a duty cycle of the divided data strobe signal by performing correction to square or align a phase of the divided data strobe signal with a time point when a phase of the data strobe signal DQS received from the first duty correction circuit 120 is 0° and 90°. Configuration of the second duty correction circuit 130 is described in detail with reference to FIG. 4.

Figure 3:
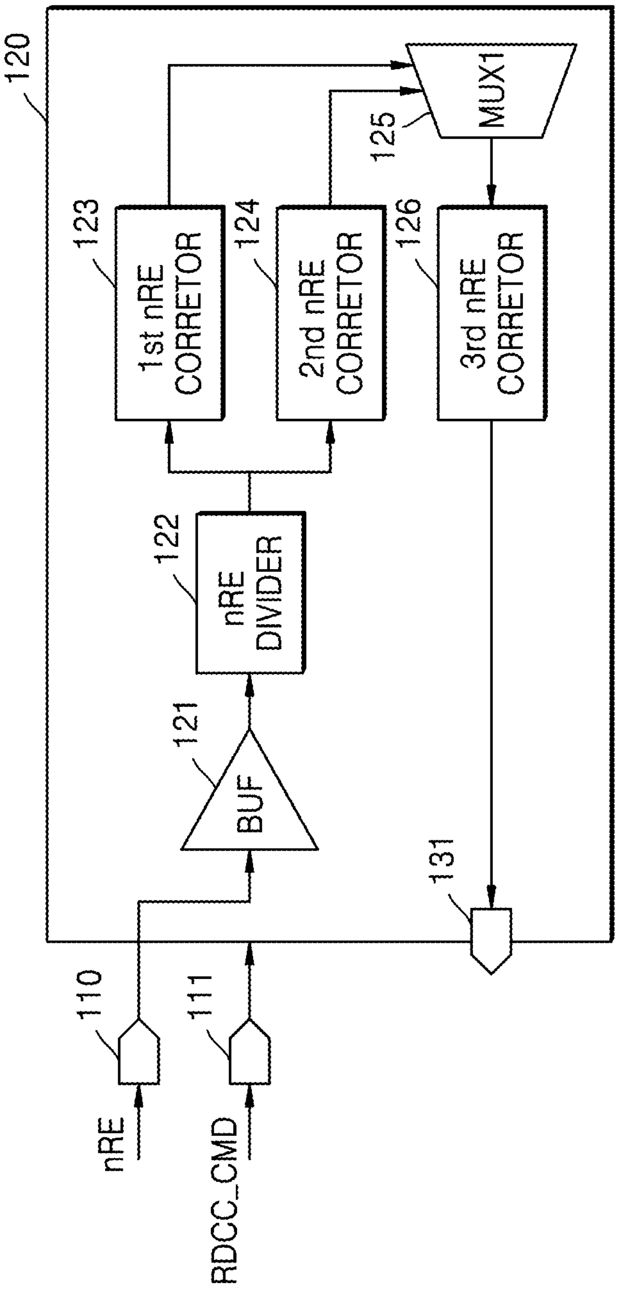
FIG. 3 is a block diagram of a first duty correction circuit according to an embodiment.

FIG. 3 is a block diagram of the first duty correction circuit 120 according to an embodiment.

Referring to FIGS. 1 and 3, the first duty correction circuit 120 according to an embodiment may include a buffer 121, a read enable signal divider 122, a first read enable signal corrector 123, a second read enable signal corrector 124, a first multiplexer 125, and a third read enable signal corrector 126. In addition, the first duty correction circuit 120 may further include a third pad 131 that outputs the data strobe signal.

In an embodiment, the first duty correction circuit 120 may not include the third pad 131. For example, like the first pad 110 or the second pad 111, the third pad 131 may be arranged outside of the first duty correction circuit 120. For example, the first duty correction circuit 120 may output the data strobe signal to the memory controller 200 through the third pad 131. The third pad 131 according to an embodiment may output the data strobe signal received from the first duty correction circuit 120 to the memory controller 200.

The buffer 121 according to an embodiment may receive the read enable signal nRE received by the first pad 110. For example, the buffer 121 may correct a duty of the read enable signal nRE received from the memory controller 200 of FIG. 1 and transmit the read enable signal nRE to the read enable signal divider 122. Nosie may be at least partially removed from an undivided read enable signal nRE according to an embodiment when the buffer 121 is activated, and after the duty thereof is corrected, the undivided read enable signal nRE may be transmitted to the read enable signal divider 122.

The read enable signal divider 122 according to an embodiment may divide the read enable signal nRE received from the buffer 121. For example, the read enable signal divider 122 may divide the read enable signal nRE such that the cycle of the read enable signal nRE is doubled. However, the criteria for dividing the received read enable signal nRE are not limited thereto in accordance with various embodiments. The read enable signal divider 122 according to an embodiment may divide the read enable signal nRE during a process of read duty cycle correct training.

The first read enable signal corrector 123 and the second read enable signal corrector 124 according to an embodiment may correct a duty cycle of the divided read enable signal. For example, the first read enable signal corrector 123 may correct the duty cycle of the divided read enable signal based on a first rising edge of the undivided read enable signal nRE. In addition, the second read enable signal corrector 124 may correct the duty cycle of the divided read enable signal based on a first falling edge of the undivided read enable signal nRE. The first rising edge according to an embodiment may be a point at which the phase of the undivided read enable signal nRE is 0°, and the first falling edge may be a point at which the phase of the undivided read enable signal nRE is 90°. The first read enable signal corrector 123 according to an embodiment may correct a duty between 0° and 180° of the divided read enable signal by performing correction to square the first rising edge of the undivided read enable signal nRE with the first rising edge of the divided read enable signal. Moreover, the second read enable signal corrector 124 may correct a duty between 90° and 270° of the divided read enable signal by performing correction to square the first falling edge of the undivided read enable signal nRE with the first rising edge of the divided read enable signal.

The first multiplexer 125 according to an embodiment may receive the divided read enable signals received from each of the first read enable signal corrector 123 and the second read enable signal corrector 124 and combine the divided read enable signals to generate a data strobe signal. For example, the first multiplexer 125 may combine a divided read enable signal of which duty between 0° and 180° has been corrected with a divided read enable signal of which duty between 90° and 270° has been corrected, and square the combined signal with the undivided read enable signal nRE received from the memory controller 200.

The third read enable signal corrector 126 according to an embodiment may remove noise from the combined read enable signal received from the first multiplexer 125 and generate a data strobe signal. For example, the third read enable signal corrector 126 may remove noise occurring during a process of combining the divided read enable signals and generate the data strobe signal DQS for performing the write duty cycle correct operation.

The third pad 131 according to an embodiment may output the signal generated by the first duty correction circuit 120 and transmit the same to the second duty correction circuit 130 of FIG. 2. For example, the first duty correction circuit 120 may generate the data strobe signal DQS from the read enable signal nRE and transmit the generated data strobe signal DQS to the second duty correction circuit 130 through the second pad 111.

Figure 4:
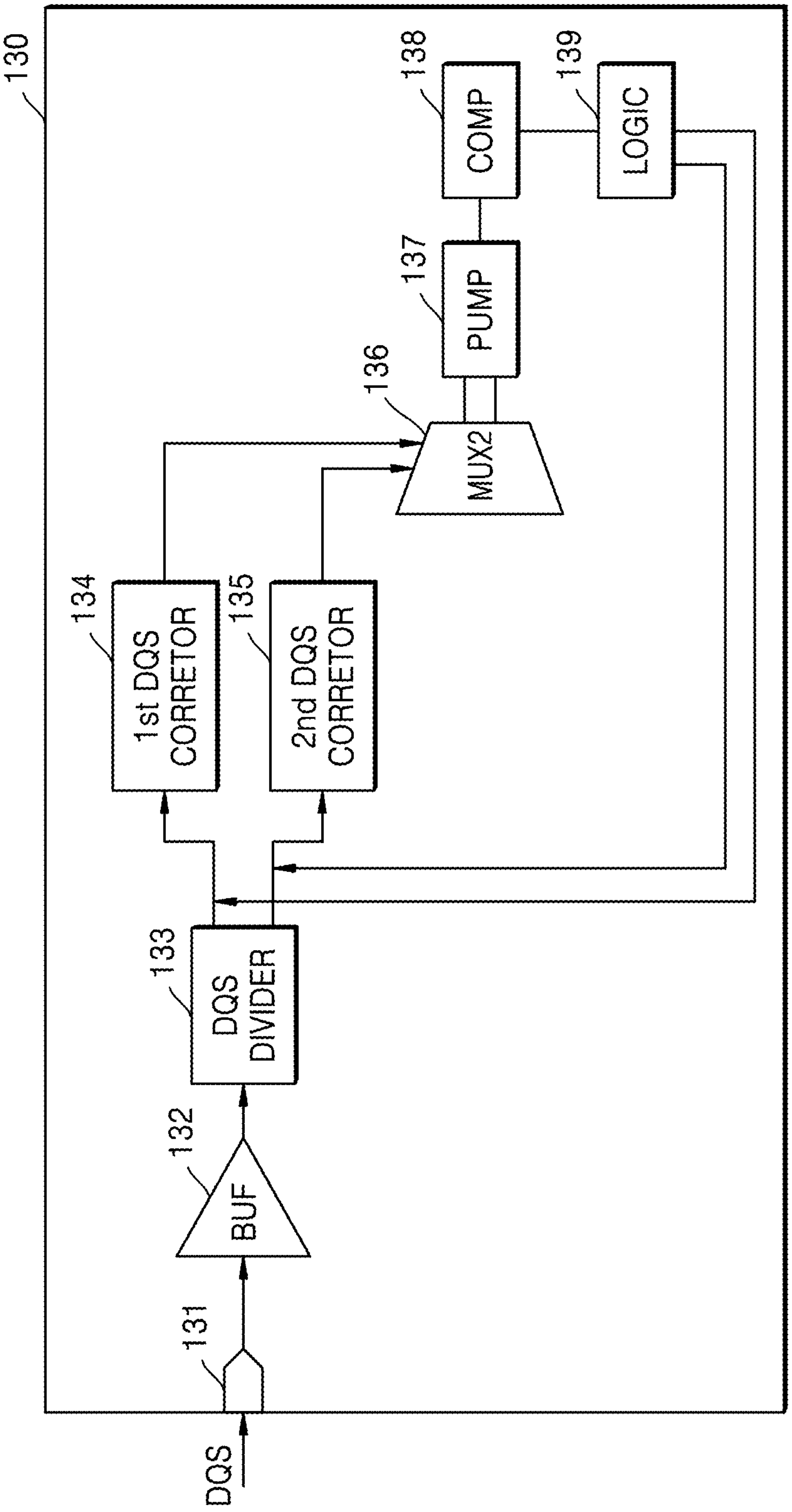
FIG. 4 is a block diagram of a second duty correction circuit according to an embodiment.

FIG. 4 is a block diagram of the second duty correction circuit 130 according to an embodiment.

Referring to FIG. 4, the second duty correction circuit 130 according to an embodiment may include a second pad 131, a data strobe signal buffer 132, a data strobe signal divider 133, a first corrector 134, a second corrector 135, a second multiplexer 136, a pump 137, a comparator 138, and a logic circuit 139.

In an embodiment, the second duty correction circuit 120 may not include the third pad 131. For example, the third pad 131 may be arranged outside of the second duty correction circuit 120. For example, the second duty correction circuit 120 may receive the data strobe signal from the third pad 131.

The second pad 131 according to an embodiment may receive the data strobe signal DQS generated from the first duty correction circuit 120 of FIGS. 2 and 3. For example, the first duty correction circuit 120 of FIGS. 2 and 3 may generate the data strobe signal DQS from the read enable signal nRE and transmit the generated data strobe signal DQS to the second duty correction circuit 130 through the third pad 131. The third pad 131 according to an embodiment may be a component included in both of the first duty correction circuit 120 and the second duty correction circuit 130 and may transmit an output signal of the first duty correction circuit 120 to the second duty correction circuit 130.

The data strobe signal buffer 132 according to an embodiment may at least partially remove noise included in the received data strobe signal DQS and correct the duty. For example, the data strobe signal buffer 132 may receive the data strobe signal DQS output from the first duty correction circuit 120. In addition, when the data strobe signal buffer 132 is activated, the second duty correction circuit 130 according to an embodiment may divide the received data strobe signal DQS and correct the duty of the divided data strobe signal.

The data strobe signal divider 133 according to an embodiment may divide the received data strobe signal DQS. For example, the data strobe signal divider 133 may divide the data strobe signal DQS during the read signal duty cycle correct operation performed in the first duty correction circuit 120 of FIGS. 2 and 3. The data strobe signal divider 133 according to an embodiment may divide the data strobe signal DQS received from the data strobe signal buffer 132 based on preset criteria. For example, the data strobe signal divider 133 may divide the data strobe signal DQS such that the cycle of the data strobe signal DQS is doubled. However, the preset criteria for dividing the received data strobe signal DQS are not limited thereto. The data strobe signal divider 133 according to an embodiment may divide the data strobe signal DQS during the write duty cycle correct training.

In an embodiment, the data strobe signal divider 133 may receive the data strobe signal DQS. The data strobe signal divider 133 may generate first to fourth clock signals based on the data strobe signal DQS. For example, a cycle of each of the first to fourth clock signals may be twice the cycle of the data strobe signal DQS. A frequency of each of the first to fourth clock signals may be half the frequency of the data strobe signal DQS.

In an embodiment, the data strobe signal divider 133 may generate the first to fourth clock signals having different phases from each other. For example, the first clock signal may have a phase of 0°. The second clock signal may have a phase of 90°. The third clock signal may have a phase of 180°. The fourth clock signal may have a phase of 270°.

In an embodiment, the second duty correction circuit 130 may perform a write duty cycle correct operation. The second duty correction circuit 130 may perform the write duty cycle correct operation to correct a duty cycle for the first to fourth clock signals. The second duty correction circuit 130 may correct a duty cycle for clock signals having a phase difference of 180°. The second duty correction circuit 130 may correct a duty cycle for the first clock signal and the third clock signal which have a phase difference of 180° and correct a duty cycle for the second clock signal and the fourth clock signal which have a phase difference of 180°.

In an embodiment, during when the first duty correction circuit 120 performs a read duty cycle correct operation, the second duty correction circuit 130 may perform the write duty cycle correct operation. That is, the read duty cycle correct operation and the write duty cycle correct operation may be performed simultaneously. For example, the first duty correction circuit 120 may perform the read duty cycle correct operation during the first and second sections. The second duty correction circuit 130 may perform the write duty cycle correct operation during the first and second sections. The second duty correction circuit 130 may correct a duty cycle for the first clock signal and the third clock signal in the first section and correct a duty cycle for the second clock signal and the fourth clock signal in the second section.

In an embodiment, the first corrector 134 may correct a duty cycle of the first clock signal and the third clock signal. The first corrector 134 may correct a duty cycle of the first clock signal having a phase of 0° and a duty cycle of the third clock signal having a phase of 180°. The second corrector 135 may correct a duty cycle of the second clock signal and the fourth clock signal. The second corrector 135 may correct a duty cycle of the second clock signal having a phase of 90° and a duty cycle of the fourth clock signal having a phase of 270°.

The first corrector 134 and the second corrector 135 according to an embodiment may correct the duty cycle of the divided data strobe signal. For example, when the data strobe signal buffer 132 is activated, the first corrector 134 or the second corrector 135 may correct the duty of the divided data strobe signal. The first corrector 134 according to an embodiment may correct a duty between the first rising edge and the second falling edge of the divided data strobe signal. For example, the first corrector 134 may correct a duty between a phase of the divided data strobe signal of 0° and a phase of 180° and a duty between a phase of 90° and a phase of 270°. Based on the duty between the first rising edge and the second rising edge of the received data strobe signal DQS, the duty of the divided data strobe signal may be corrected.

In addition, the second corrector 135 according to an embodiment may correct the duty of the divided data strobe signal based on the duty between the first falling edge and the second falling edge of the received data strobe signal DQS. For example, the second corrector 135 may correct a duty between the first falling edge and the second falling edge of the divided data strobe signal. The second corrector 135 according to an embodiment may correct a duty between a phase of the divided data strobe signal of 90° and a phase of 270°.

The first rising edge according to an embodiment may be a point at which a phase of the divided data strobe signal DQS is 0°. The first corrector 134 according to an embodiment may correct a duty between 0° and 180° of the divided data strobe signal by performing correction to square the first rising edge of the undivided data strobe signal DQS with the first rising edge of the divided data strobe signal. The second corrector 135 may correct a duty between 90° and 270° of the divided data strobe signal by performing correction to square the first falling edge of the undivided data strobe signal DQS with the first rising edge of the divided data strobe signal.

The second multiplexer 136 according to an embodiment may receive from the first corrector 134 or the second corrector 135 the data strobe signal of which the duty cycle is corrected and select a data strobe signal to be used in write duty cycle correct training. For example, the second multiplexer 136 may receive from the first corrector 134 a divided data strobe signal of which duty between 0° and 180° is corrected, and perform the write duty cycle correct training with respect to the divided data strobe signal of which duty between 0° and 180° is corrected. In addition, the second multiplexer 136 may receive from the second corrector 135 a divided data strobe signal of which duty between 0° and 180° is corrected, and perform the write duty cycle correct training with respect to the divided data strobe signal of which duty between 90° and 270° is corrected.

The pump 137 and the comparator 138 according to an embodiment may receive the divided data strobe signal of which duty between 0° and 180° is corrected or the divided data strobe signal of which duty between 90° and 270° is corrected, and sense whether the duty of the divided data strobe signal needs to be corrected. For example, the pump 137 may, for example, sense whether there has been an error in the duty cycle due to a delay of the divided data strobe signal of which duty between 0° and 180° is corrected or the divided data strobe signal of which duty between 90° and 270° is corrected.

The pump 137 according to an embodiment may transmit the sensing results regarding the duty of the divided data strobe signal of which duty is corrected to the comparator 138. When a divided data strobe signal of which delayed duty between 0° and 180° has been sensed or a divided data strobe signal of which delayed duty between 90° and 270° has been sensed is transmitted to the comparator 138, the comparator 138 according to an embodiment may determine whether there has been a delay with respect to any one of the divided data strobe signal of which duty between 0° and 180° has been corrected and the divided data strobe signal of which duty between 90° and 270° has been corrected based on a select signal received from the second multiplexer 136. For example, the comparator 138 may generate an output signal having a logic value High when it is determined that there has been a delay in any one of the divided data strobe signal of which duty between 0° and 180° has been corrected and the divided data strobe signal of which duty between 90° and 270° has been corrected. In another example, the comparator 138 may generate an output signal having a logic value Low when it is determined that there has not been a delay in any one of the divided data strobe signal of which duty between 0° and 180° has been corrected and the divided data strobe signal of which duty between 90° and 270° has been corrected.

The logic circuit 139 according to an embodiment may act as a counter in the second duty correction circuit 130. For example, the logic circuit 139 may determine whether the duty cycle correction of the divided data strobe signal of which duty between 0° and 180° has been corrected or the divided data strobe signal of which duty between 90° and 270° has been corrected, each received from the comparator 138, has been performed according to preset criteria. The logic circuit 139 according to an embodiment may determine whether the duty cycle correction of the divided data strobe signal of which duty between 0° and 180° has been corrected or the divided data strobe signal of which duty between 90° and 270° has been corrected, each received from the comparator 138, has been performed according to preset criteria, and when the preset criteria were not met, the divided data strobe signal of which duty between 0° and 180θ has been corrected or the divided data strobe signal of which duty between 90° and 270° has been corrected may be transmitted back to the first corrector 134 or the second corrector 135. When it is determined that the duty cycle correction of the divided data strobe signal of which duty between 0° and 180° has been corrected or the divided data strobe signal of which duty between 90° and 270° has been corrected has been performed according to the preset criteria, the logic circuit 139 according to an embodiment may terminate the write duty cycle correct operation and render the memory controller 200 correct the data strobe signal DQS.

Figure 5A:
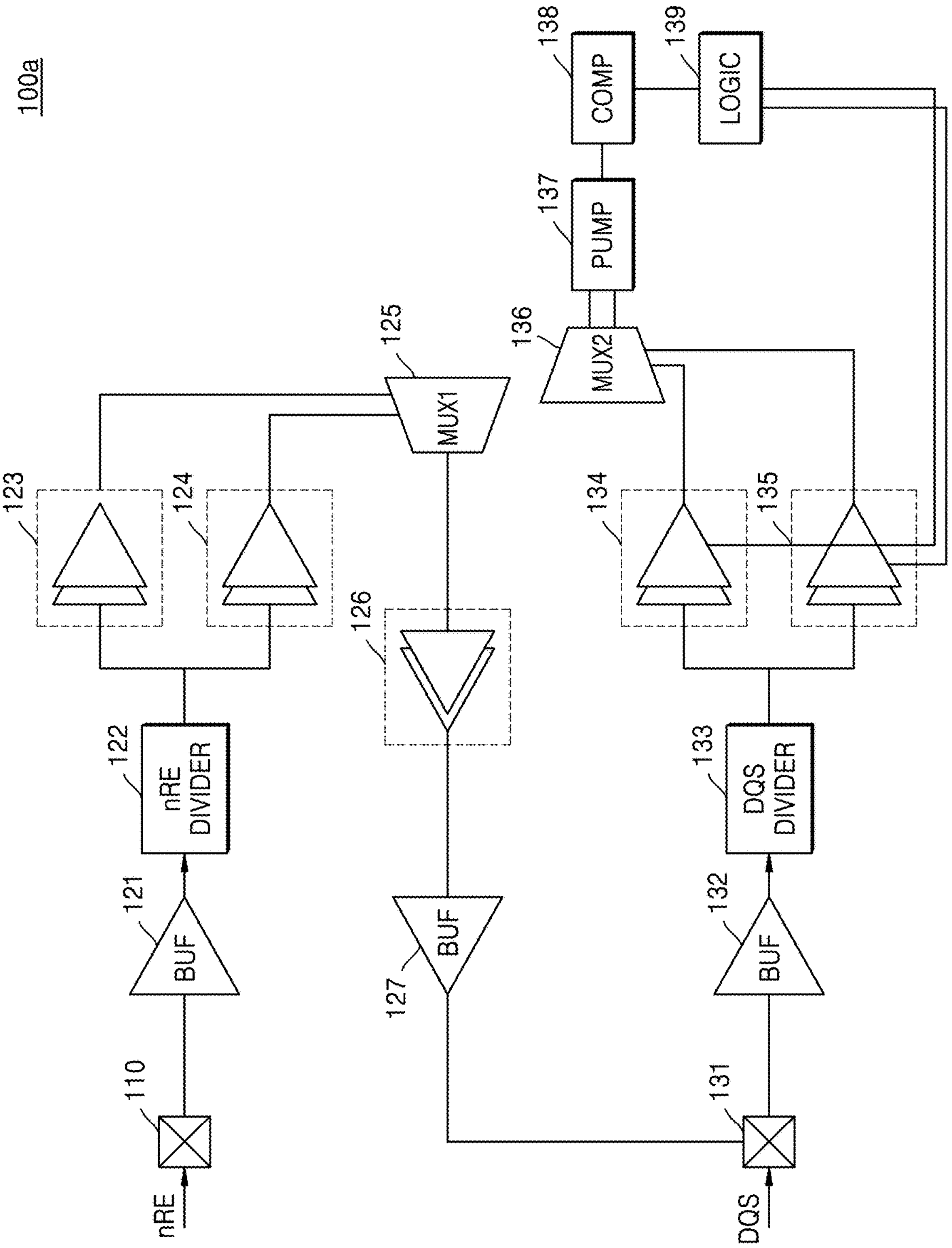
FIGS. 5A to 5C are each a block diagram illustrating a configuration of a memory device according to an embodiment.

FIG. 5A is a block diagram illustrating configuration of a memory device 100*a* according to an embodiment.

Referring to FIGS. 3, 4, and 5A, the first duty correction circuit 120 according to an embodiment may include the buffer 121, the read enable signal divider 122, the first read enable signal corrector 123, the second read enable signal corrector 124, the first multiplexer 125, and the third read enable signal corrector 126, and may further include an output buffer 127. In addition, the second duty correction circuit 130 according to an embodiment may include the third pad 131, the data strobe signal buffer 132, the data strobe signal divider 133, the first corrector 134, the second corrector 135, the second multiplexer 136, the pump 137, the comparator 138, and the logic circuit 139. The memory device 100 according to an embodiment of FIG. 5 may have the same configuration as the memory device 100 according to embodiments of FIGS. 3 and 4. In the embodiment of FIG. 5, any redundant descriptions of the components which have already been described in the embodiment of FIGS. 3 and 4 will be omitted, and the first read enable signal corrector 123, the second read enable signal corrector 124, the third read enable signal corrector 126, the output buffer 127, the first corrector 134, and the second corrector 135 are to be described in detail.

Each of the first read enable signal corrector 123, the second read enable signal corrector 124, the third read enable signal corrector 126 according to an embodiment may include a stacked inverter. Each of the first read enable signal corrector 123, the second read enable signal corrector 124, the third read enable signal corrector 126 according to an embodiment may receive a read enable signal by including a stacked inverter, and may correct a duty cycle of the received read enable signal.

In another example, the first read enable signal corrector 123, the second read enable signal corrector 124, and the third read enable signal corrector 126 may each include a current mode logic (CML). Each of the first read enable signal corrector 123, the second read enable signal corrector 124, the third read enable signal corrector 126 according to an embodiment may receive a read enable signal by including a current mode logic, and may correct a duty cycle of the received read enable signal.

The output buffer 127 according to an embodiment may receive a corrected read enable signal from the third read enable signal corrector 126 and render the data strobe signal DQS to be received by the third pad 131. For example, the output buffer 127 may transmit to the third pad 131 the corrected read enable signal as a data strobe signal.

The first corrector 134 and the second corrector 135 according to an embodiment may each include a stacked inverter. Each of the first corrector 134 and the second corrector 135 according to an embodiment may receive the data strobe signal DQS by including a stacked inverter and correct a duty cycle of the received data strobe signal DQS.

In another example, each of the first corrector 134 and the second corrector 135 may include a current mode logic. Each of the first corrector 134 and the second corrector 135 according to an embodiment may receive the read enable signal by including a current mode logic and correct a duty cycle of the received read enable signal.

Figure 5B:
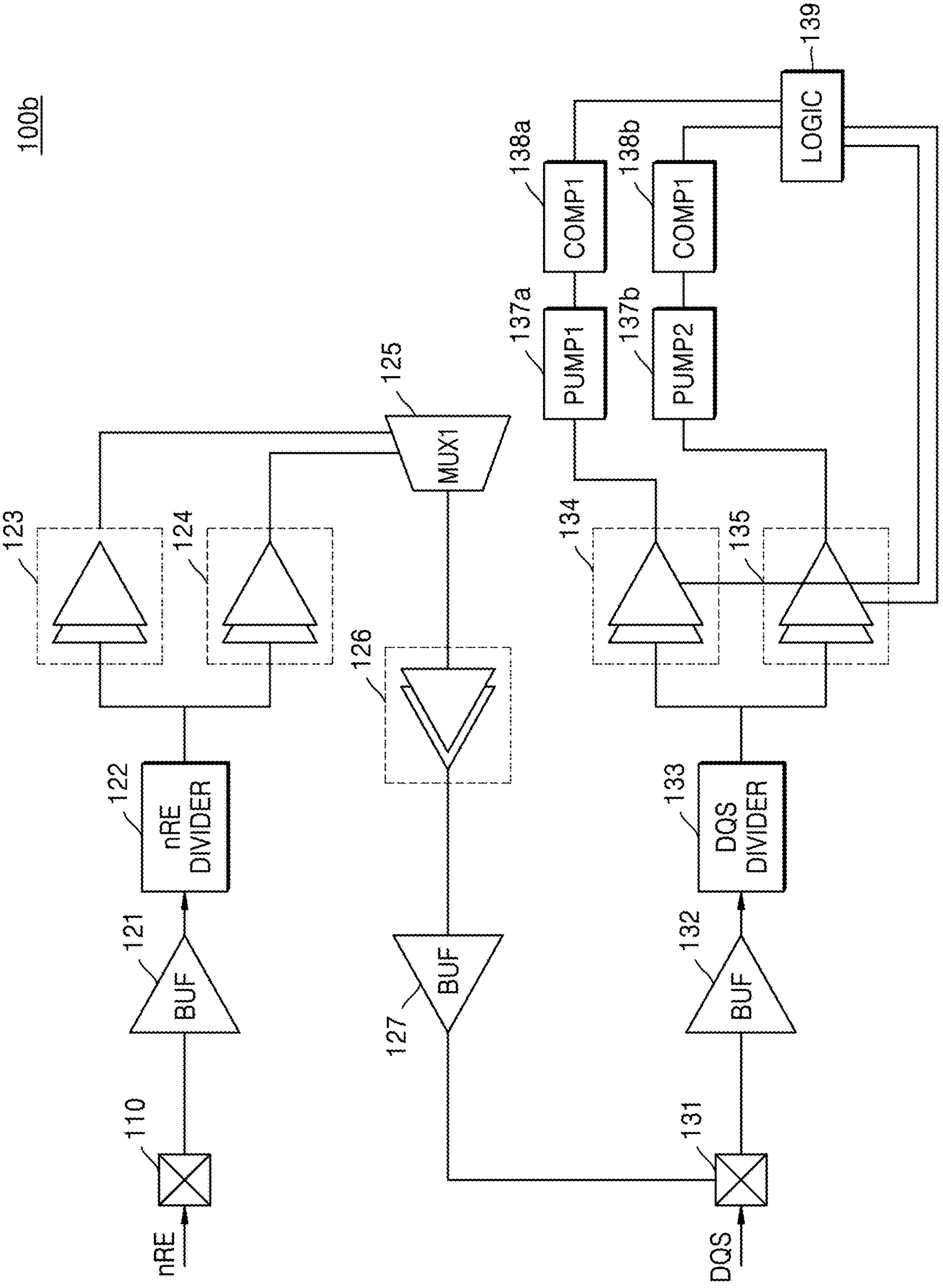

FIG. 5B illustrates an embodiment in which a multiplexer is not present in a second duty correction circuit. As a memory device 100*b* illustrated in FIG. 5B includes the same components as in the embodiment of FIG. 5A except that the second multiplexer 136 illustrated in FIG. 5A is not included, FIG. 5B will be described by focusing on the differences with the memory device 100*a* of FIG. 5A.

When the second duty correction circuit according to an embodiment does not include a multiplexer, the memory device 100*b* may include a pump 137*a*, a second pump 137*b*, a first comparator 138*a*, and a second comparator 138*b*.

The data strobe signal of which duty between 0° and 180° according to an embodiment has been corrected may be input to the first pump 137*a*. For example, the first pump 137*a* may receive the divided data strobe signal of which duty between 0° and 180° has been corrected, sense whether correction of the duty of the received divided data strobe signal is needed, and transmit to the first comparator 138 the received divided data strobe signal of which duty between 0° and 180° has been corrected.

The data strobe signal of which duty between 90° and 170° according to an embodiment has been corrected may be input to the second pump 137*b*. For example, the second pump 137*b* may receive the divided data strobe signal of which duty between 90° and 270° has been corrected, sense whether correction of the duty of the received divided data strobe signal is needed, and transmit to the second comparator 138*b* the received divided data strobe signal of which duty between 90° and 270° has been corrected.

Figure 5C:
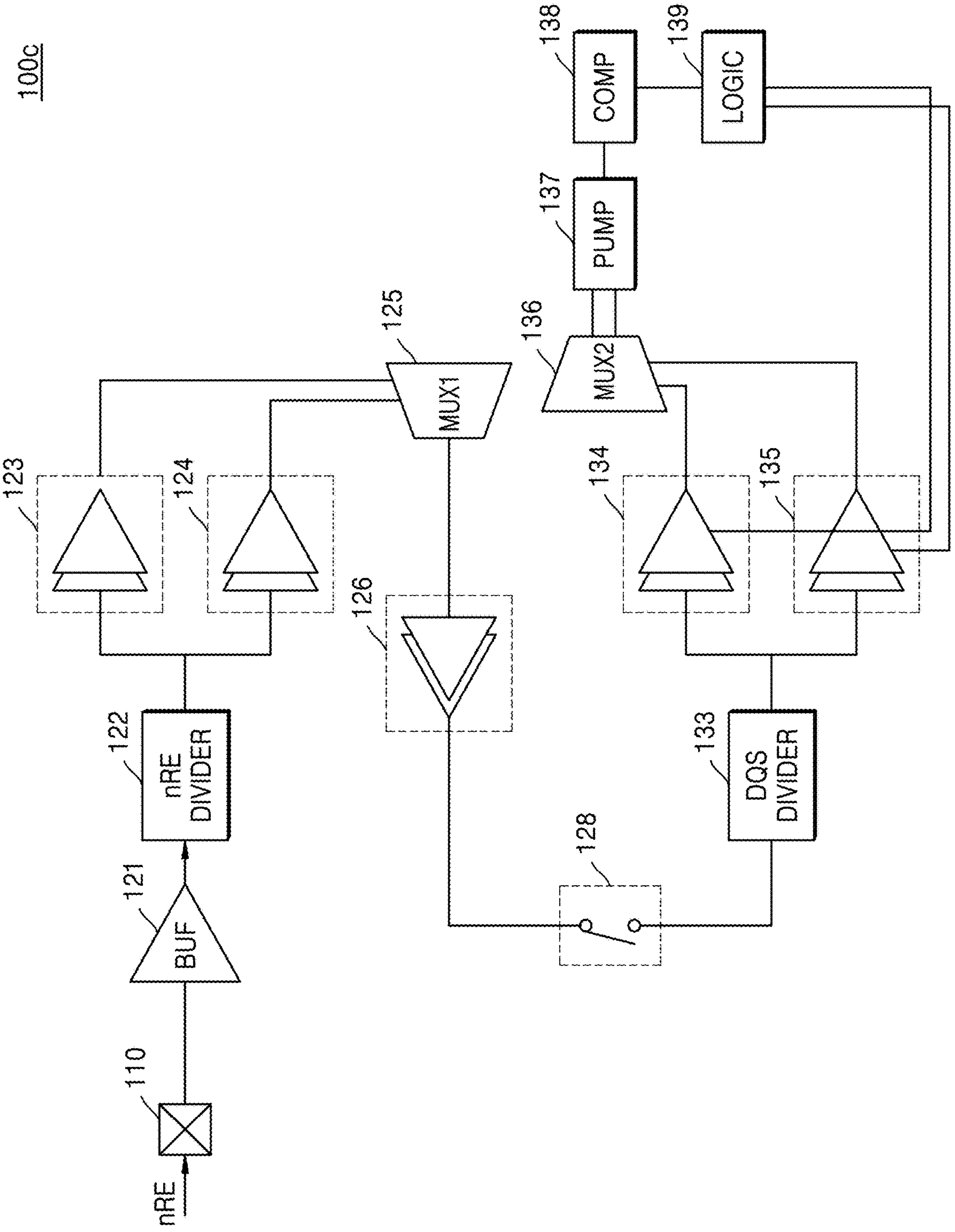

FIG. 5C illustrates configuration of a memory device 100*c* which does not include an output buffer and a data strobe signal buffer and configured to correct a duty cycle. The memory device 100*c* of FIG. 5C may not include the output buffer 127, the third pad 131, and the data strobe signal buffer 132 included in the memory device 100*a* of FIG. 5A, and in the memory device 100*c*, the divided data strobe signal may be input to the data strobe signal divider 133 directly through a short path switch 128 included in the memory device 100*c*.

Referring to FIGS. 5A and 5C, the first duty correction circuit 120 according to an embodiment may include the buffer 121, the read enable signal divider 122, the first read enable signal corrector 123, the second read enable signal corrector 124, the first multiplexer 125, and the third read enable signal corrector 126, and may transmit the corrected read enable signal as the data strobe signal directly to the second duty correction circuit 130 through the short path switch 128.

The second duty correction circuit 130 according to an embodiment may include the data strobe signal divider 133, the first corrector 134, the second corrector 135, the second multiplexer 136, the pump 137, the comparator 138, and the logic circuit 139. The memory device 100*c* according to an embodiment of FIG. 5C may have the same configuration as the memory device 100 according to embodiments of FIGS. 3 and 4. In the embodiment of FIG. 5C, any redundant descriptions of the components illustrated in FIGS. 3, 4 and 5A are omitted, and the short path switch 128 is to be described in detail.

In an embodiment, the short path switch 128 may be connected between the first duty correction circuit 120 and the second duty correction circuit 130. When the short path switch 128 is turned on, the second duty correction circuit 130 may receive the data strobe signal from the first duty correction circuit 120.

The short path switch 128 according to an embodiment may transmit the corrected read enable signal as the data strobe signal directly to the second duty correction circuit 130. In the memory device 100*c* according to an embodiment, when the data strobe signal pad of the plurality of dies or the memory blocks simultaneously receive the read enable signal nRE, each memory block or die may receive the read enable signal nRE through the short path switch 128 and perform the write duty cycle correct operation by using the received read enable signal nRE as a data strobe signal. For example, in the memory device 100*c*, the read enable signal nRE may be transmitted to the second duty correction circuit 130 of the dies or the plurality of memory blocks through the short path switch 128, and each of the second duty correction circuits 130 included in the dies and the plurality of memory blocks may simultaneously perform the duty cycle correct operation with respect to the data strobe signal.

Figure 6:
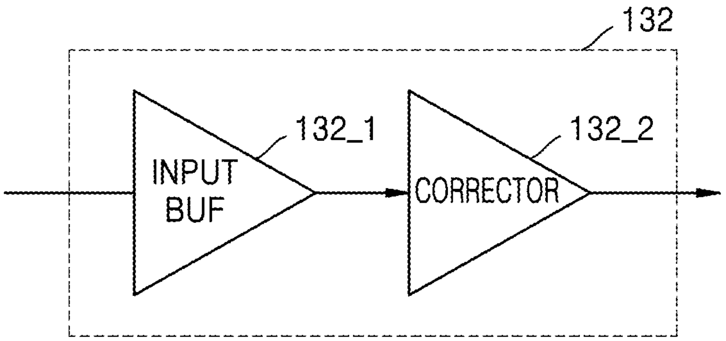
FIG. 6 is a circuit diagram of a buffer according to an embodiment.

FIG. 6 is a circuit diagram of the data strobe signal buffer 132 according to an embodiment.

Referring to FIGS. 3 and 6, the data strobe signal buffer 132 according to an embodiment may include an input buffer 132_1 and a corrector 132_2. When the input buffer 132_1 according to an embodiment is activated, the data strobe signal DQS may be input to the input buffer 132_1 and be transmitted to the data strobe signal buffer 132. When the data strobe signal DQS is received by the input buffer 132_1, the corrector 132_2 according to an embodiment may at least partially remove noise included in the received data strobe signal DQS and correct a duty thereof. Unlike the data strobe signal received directly from the memory controller 200 of FIG. 1, as the data strobe signal DQS received by the data strobe signal buffer 132 is generated based on the read enable signal nRE, the data strobe signal DQS may include noise or a duty thereof may not be constant. However, as the data strobe signal buffer 132 includes the input buffer 132_1 and the corrector 132_2, the noise included in the data strobe signal DQS received from the first duty correction circuit may be at least partially removed, and the duty thereof may be corrected.

Figure 7:
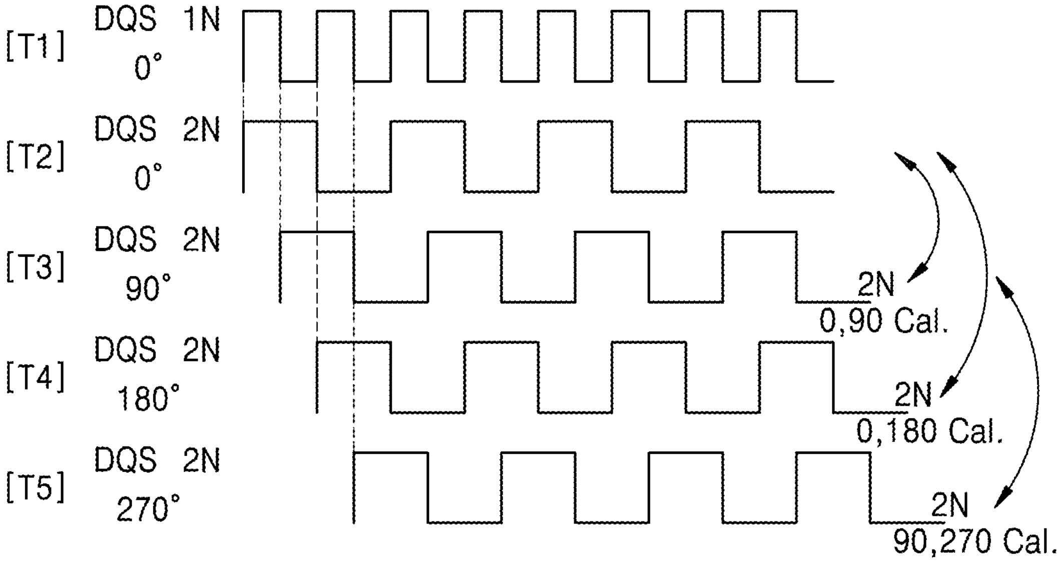
FIG. 7 is a timing chart of a data strobe signal according to an embodiment.

FIG. 7 is a timing chart of the data strobe signal DQS according to an embodiment.

Referring to FIG. 7, the data strobe signal DQS according to an embodiment may have a timing chart T1 when the data strobe signal DQS is not divided or may have timing charts T2 to T5 depending on a degree of correction of phase when the data strobe signal DQS is divided. The timing chart T1 of the undivided data strobe signal according to an embodiment may be described as having a 1N duty. The 1N duty according to an embodiment may be a duty of uncorrected duty cycle of the data strobe signal DQS received from the first duty correction circuit 120 illustrated in FIGS. 2 and 3.

When the duty of the data strobe signal according to an embodiment is twice the duty of the data strobe signal received by the second duty correction circuit 130, and the phase of the first rising edge of the undivided data strobe signal is identical to the phase of the first rising edge of the divided strobe signal, the timing chart T2 may be an illustrative example.

When the duty of the data strobe signal according to an embodiment is twice the duty of the data strobe signal received by the second duty correction circuit 130, and the phase of the first falling edge of the undivided data strobe signal is identical to the phase of the first rising edge of the divided strobe signal, the timing chart T3 may be an illustrative example. For example, the divided data strobe signal having the timing chart T3 may have a phase difference of 90° with the divided data strobe signal having the timing chart T2. The divided data strobe signal having the timing chart T3 according to an embodiment may be a signal of which duty cycle is corrected based on the first falling edge of an undivided data strobe signal DQS_1N.

When the duty of the data strobe signal according to an embodiment is twice the duty of the data strobe signal received by the second duty correction circuit 130, and the phase of the second rising edge of the undivided data strobe signal is identical to the phase of the first rising edge of the divided strobe signal, the timing chart T4 may be an illustrative example. For example, the divided data strobe signal having the timing chart T4 may have a phase difference of 180° with the divided data strobe signal having the timing chart T2. The divided data strobe signal having the timing chart T4 according to an embodiment may be a signal of which duty cycle is corrected based on the second rising edge of the undivided data strobe signal DQS_1N.

When the duty of the data strobe signal according to an embodiment is twice the duty of the data strobe signal received by the second duty correction circuit 130, and the phase of the second falling edge of the undivided data strobe signal is identical to the phase of the first rising edge of the divided strobe signal, the timing chart T5 may be an illustrative example. For example, the divided data strobe signal having the timing chart T5 may have a phase difference of 90° with the divided data strobe signal having the timing chart T3. The divided data strobe signal having the timing chart T5 according to an embodiment may be a signal of which duty cycle is corrected based on the second falling edge of the undivided data strobe signal DQS_1N.

Figure 8:
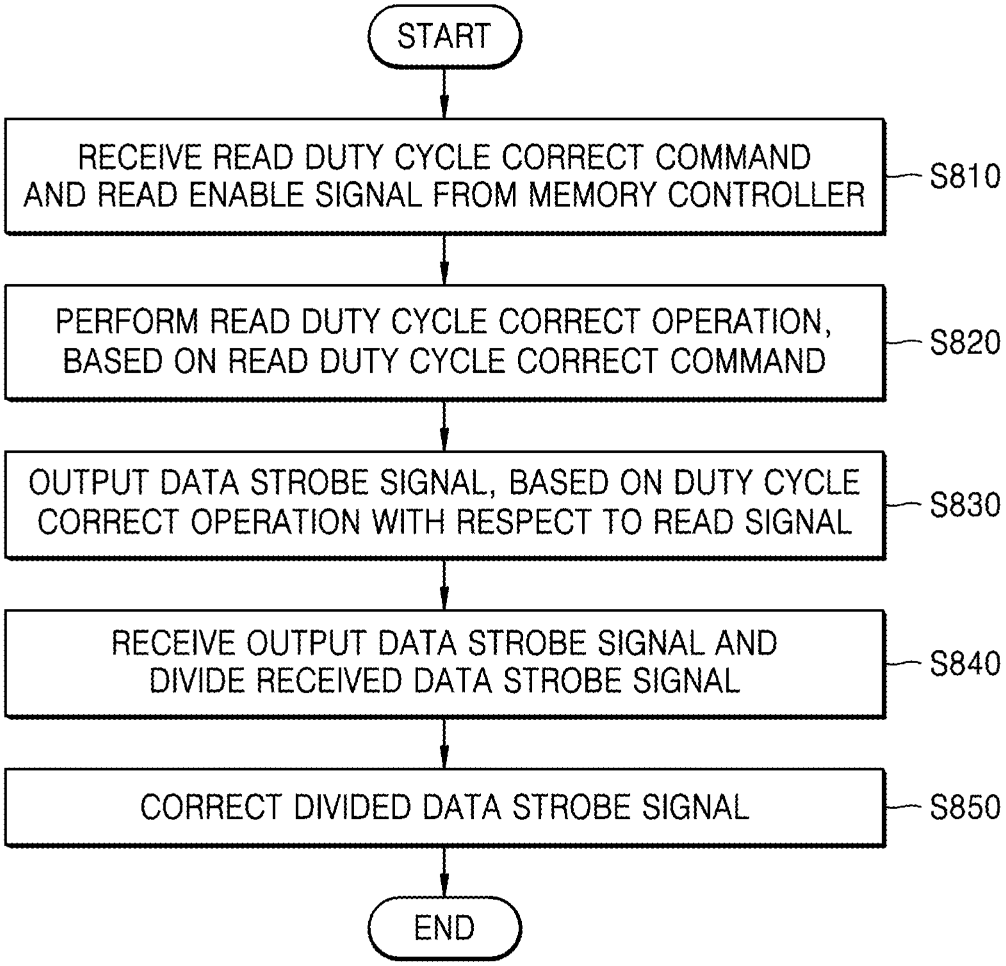
FIG. 8 is a flowchart illustrating an operating method of a memory device according to an embodiment.

FIG. 8 is a flowchart illustrating an operating method of a memory device according to an embodiment.

Referring to FIGS. 1 and 8, the memory device 100 according to an embodiment may receive the read duty cycle correct command RDCC_CMD and the read enable signal nRE from the memory controller (S810). For example, when read duty cycle correct training is performed in the memory device 100, the memory controller 200 may generate the read duty cycle correct command RDCC_CMD and the read enable signal nRE and transmit the generated read duty cycle correct command RDCC_CMD and the read enable signal nRE to the memory device 100.

When the read duty cycle correct command RDCC_CMD and the read enable signal nRE are received from the memory controller, the memory device 100 according to an embodiment may perform the read duty cycle correct operation based on the read duty cycle correct command RDCC_CMD (S820). The read duty cycle correct operation according to an embodiment may be an operation of correcting a duty cycle of the read enable signal nRE when a training operation for the read signal is performed.

When the read duty cycle correct operation is performed, the memory device 100 according to an embodiment may output a data strobe signal based on the read duty cycle correct operation (S830). For example, the memory device 100 may correct the read enable signal nRE by performing the read duty cycle training operation and the read duty cycle correct operation based on the received read duty cycle correct command RDCC_CMD and output the data strobe signal.

When the data strobe signal is output, the memory device 100 according to an embodiment may receive the output data strobe signal and divide the received data strobe signal (S840). The memory device 100 according to an embodiment may divide the data strobe signal based on preset criteria. The preset criteria according to which the data strobe signal is divided according to an embodiment may adjust a duty interval by adjusting a cycle of the data strobe signal. For example, the memory device 100 may divide the data strobe signal such that the cycle of the data strobe signal is doubled. However, the preset criteria for dividing the received data strobe signal are not limited thereto in accordance with various embodiments.

When the data strobe signal is divided, the memory device 100 according to an embodiment may compare the received data strobe signal with the divided data strobe signal and perform the write duty cycle correct operation (S850). The memory device 100 according to an embodiment may correct the divided data strobe signal based on the first rising edge and the first falling edge of the data strobe signal. For example, the memory device 100 may correct the duty of the divided data strobe signal based on the duty between the first rising edge and the second rising edge of the received data strobe signal and correct the duty of the divided data strobe signal based on the duty between the first falling edge and the second falling edge of the received data strobe signal. That is, the memory device 100 according to an embodiment may correct the duty cycle of the divided data strobe signal by performing correction to square the phase of the divided data strobe signal with the time point when the phase of the data strobe signal is 0° and 90°.

Figure 9:
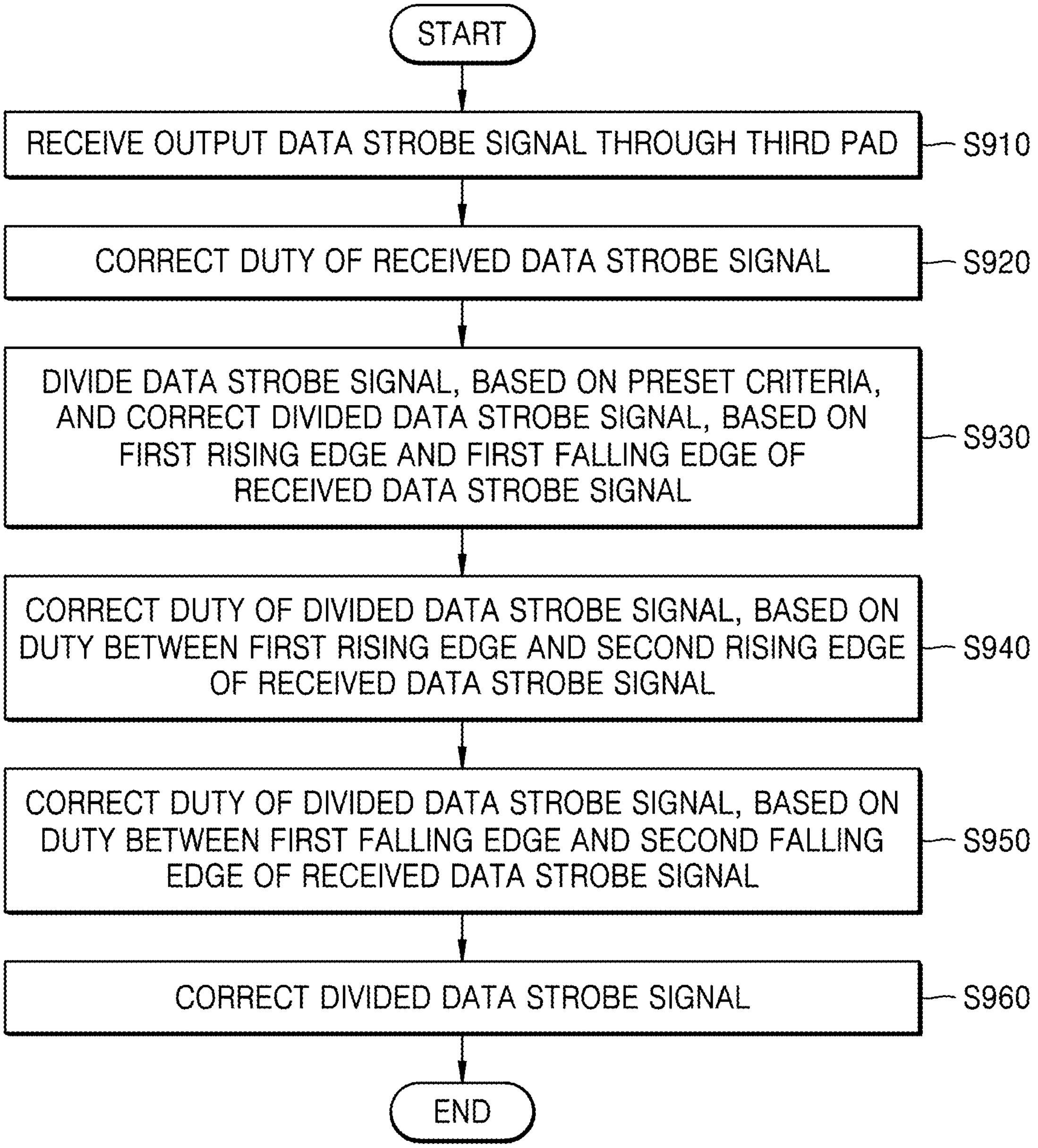
FIG. 9 is a flowchart illustrating duty cycle correction of a data strobe signal in an operating method of a memory device according to an embodiment.

FIG. 9 is a flowchart illustrating duty cycle correction of a data strobe signal in an operating method of a memory device according to an embodiment.

Referring to FIGS. 1, 4, and 9, the memory device 100 according to an embodiment may receive the output data strobe signal DQS through the third pad 131 (S910). For example, the memory device 100 may generate the data strobe signal DQS from the read enable signal nRE and transmit the generated data strobe signal DQS to the second duty correction circuit 130 through the third pad 131.

When the output data strobe signal DQS is received, the memory device 100 according to an embodiment may correct the duty of the received data strobe signal (S920).

The memory device 100 according to an embodiment may divide the data strobe signal DQS based on the preset criteria and correct the divided data strobe signal based on the first rising edge and the first falling edge of the received data strobe signal DQS (S930). In addition, the memory device 100 according to an embodiment may correct the duty of the divided data strobe signal based on the duty between the first rising edge and the second rising edge of the received data strobe signal DQS (S940). In addition, the memory device 100 according to an embodiment may correct the duty of the divided data strobe signal based on the duty between the first falling edge and the second falling edge of the received data strobe signal DQS (S950).

The memory device 100 according to an embodiment may correct the duty cycle of the divided data strobe signal. For example, when the data strobe signal buffer 132 is activated, the memory device 100 may correct the duty of the divided data strobe signal. The memory device 100 according to an embodiment may correct the duty of the divided data strobe signal based on the duty between the first rising edge and the second rising edge of the received data strobe signal DQS. In addition, the memory device 100 according to an embodiment may correct the duty of the divided data strobe signal based on the duty between the first falling edge and the second falling edge of the received data strobe signal DQS. The first rising edge according to an embodiment may be a point at which the phase of the undivided data strobe signal DQS is 0°, and the first falling edge may be a point at which the phase of the undivided data strobe signal DQS is 90°.

The memory device 100 according to an embodiment may correct a duty between 0° and 180° of the divided data strobe signal by performing correction to square the first rising edge of the undivided data strobe signal DQS with the first rising edge of the divided data strobe signal. The memory device 100 may correct a duty between 90° and 270° of the divided data strobe signal by performing correction to square the first falling edge of the undivided data strobe signal DQS with the first rising edge of the divided data strobe signal.

During the correction of the divided data strobe signal, the memory device 100 according to an embodiment may compare the received data strobe signal DQS with the divided data strobe signal and perform the write duty cycle correct operation (S960). The write duty cycle correct operation according to an embodiment may be an operation of correcting a duty cycle of the data strobe signal when a training operation for the write signal is performed. The memory device 100 according to an embodiment may reduce time and power required for the duty cycle correct training operation by generating the data strobe signal based on the read enable signal nRE and performing the training operation with respect to the write signal by using the generated data strobe signal.

Figure 10:
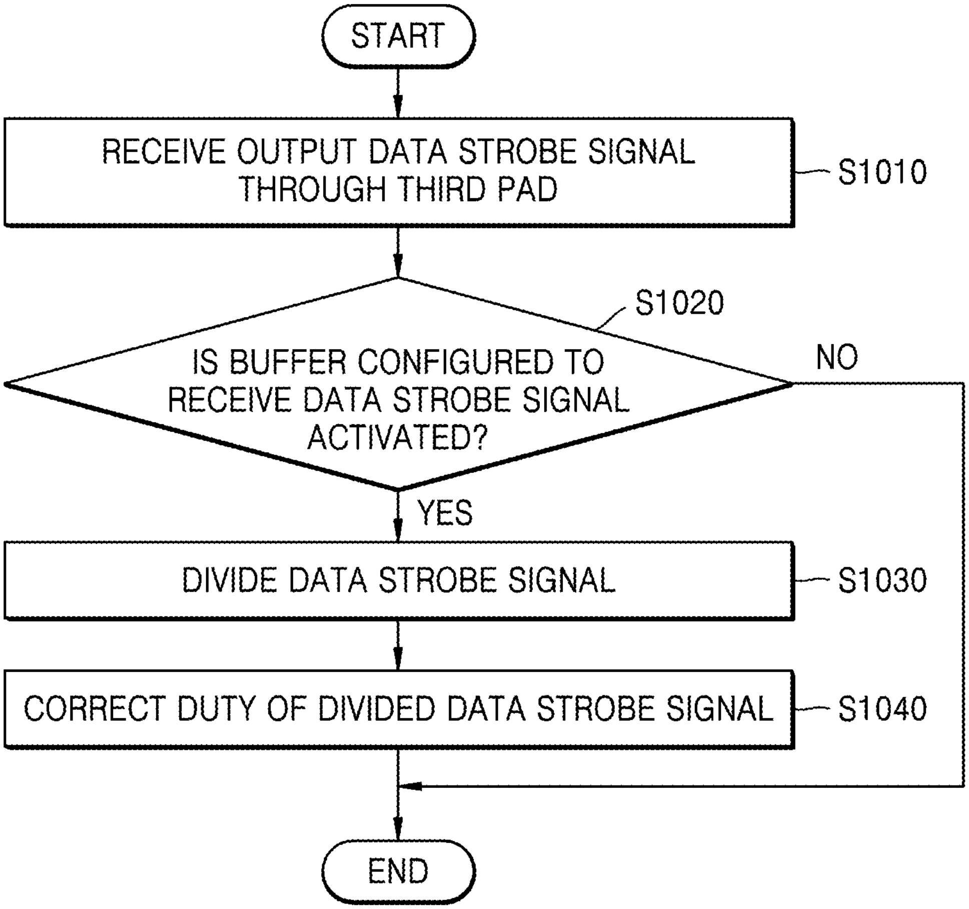
FIG. 10 is a flowchart illustrating an example in which a buffer receiving a data strobe signal is activated in an operating method of a memory device according to an embodiment.

FIG. 10 is a flowchart illustrating an example in which a buffer receiving a data strobe signal is activated in an operating method of a memory device according to an embodiment.

Referring to FIGS. 3 to 5 and 10, the memory device 100 according to an embodiment may receive the output data strobe signal DQS through the third pad 131 (S1010). For example, the first duty correction circuit 120 of FIGS. 2 and 3 may generate the data strobe signal DQS from the read enable signal nRE and transmit the generated data strobe signal DQS to the second duty correction circuit 130 through the third pad 131.

When the data strobe signal DQS is received by the third pad 131 according to an embodiment, the memory device 100 according to an embodiment may determine whether the data strobe signal buffer 132 is activated (S1020).

When it is determined that the data strobe signal buffer 132 is activated, the memory device 100 according to an embodiment may divide the data strobe signal DQS (S1030). When the data strobe signal buffer 132 is activated, the second duty correction circuit 130 according to an embodiment may divide the received data strobe signal DQS and correct the duty of the divided data strobe signal.

When it is determined that the data strobe signal buffer 132 is not activated, the memory device 100 according to an embodiment may not divide the data strobe signal DQS and terminate the write duty cycle correct operation.

When the data strobe signal DQS is divided the memory device 100 according to an embodiment may correct the duty of the divided data strobe signal (S1040). For example, the memory device 100 may correct the duty cycle of the divided data strobe signal based on the first rising edge of the undivided data strobe signal DQS. In addition, the memory device 100 may correct the duty cycle of the divided data strobe signal based on the first falling edge of the undivided data strobe signal DQS. The first rising edge according to an embodiment may be a point at which the phase of the undivided data strobe signal DQS is 0°, and the first falling edge may be a point at which the phase of the undivided data strobe signal DQS is 90°. The memory device 100 according to an embodiment may correct a duty between 0° and 180° of the divided data strobe signal by performing correction to square the first rising edge of the undivided data strobe signal DQS with the first rising edge of the divided data strobe signal. The memory device 100 may correct a duty between 90° and 270° of the divided data strobe signal by performing correction to square the first falling edge of the undivided data strobe signal DQS with the first rising edge of the divided data strobe signal.

Figure 11:
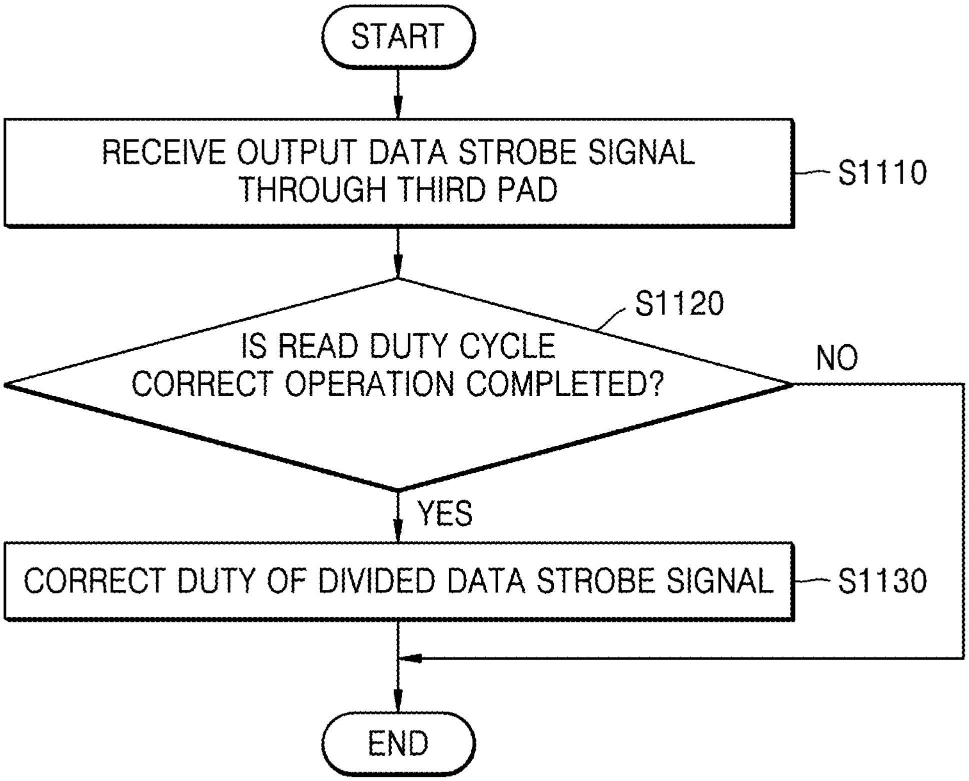
FIG. 11 is a flowchart illustrating an example in which a read duty cycle correct operation is completed in an operating method of a memory device according to an embodiment.

FIG. 11 is a flowchart illustrating an example in which a read duty cycle correct operation is completed in an operating method of a memory device according to an embodiment.

Referring to FIGS. 2, 4, and 11, the memory device 100 according to an embodiment may receive the output data strobe signal DQS through the third pad (S1110). For example, the first duty correction circuit 120 of FIGS. 2 and 3 may generate the data strobe signal DQS from the read enable signal nRE and transmit the generated data strobe signal DQS to the second duty correction circuit 130 through the third pad 131.

The memory device 100 according to an embodiment may determine whether the read duty cycle correct operation is completed (S1120). The read duty cycle correct operation according to an embodiment may be an operation of correcting a duty cycle of the read enable signal nRE when a training operation for the read signal is performed. For example, the memory device 100 may correct the read enable signal nRE by performing the read duty cycle training operation and the read duty cycle correct operation based on the received read duty cycle correct command RDCC_CMD and output the data strobe signal DQS.

When it is determined that the read duty cycle correct operation is completed, the memory device 100 according to an embodiment may correct the duty of the divided data strobe signal (S1130).

The memory device 100 according to an embodiment may receive the data strobe signal DQS and divide the received data strobe signal DQS. In addition, the memory device 100 may compare the data strobe signal DQS with the divided data strobe signal and perform the write duty cycle correct operation. The memory device 100 according to an embodiment may divide the data strobe signal DQS based on preset criteria. The preset criteria according to which the data strobe signal DQS is divided according to an embodiment may adjust a duty interval by adjusting a cycle of the data strobe signal DQS. For example, the memory device 100 may divide the data strobe signal DQS such that the cycle of the data strobe signal DQS is doubled. However, the preset criteria for dividing the received data strobe signal DQS are not limited thereto in accordance with various embodiments.

When the data strobe signal DQS is divided, the memory device 100 according to an embodiment may correct the divided data strobe signal based on the first rising edge and the first falling edge of the data strobe signal DQS. For example, the memory device 100 may correct the duty of the divided data strobe signal based on the duty between the first rising edge and the second rising edge of the received data strobe signal DQS and correct the duty of the divided data strobe signal based on the duty between the first falling edge and the second falling edge of the received data strobe signal DQS. That is, the memory device 100 according to an embodiment may correct a duty cycle of the divided data strobe signal by performing correction to square a phase of the divided data strobe signal with a time point when a phase of the data strobe signal DQS received from the first duty correction circuit 120 is 0° and 90°.

However, when it is determined that the read duty cycle correct operation is not completed, the memory device 100 according to an embodiment may not divide the data strobe signal DQS and terminate the write duty cycle correct operation.

In an embodiment, the read duty cycle correct operation may be performed simultaneously with a first write duty cycle correct operation. That is, the memory device 100 may simultaneously perform the read duty cycle correct operation and the first write duty cycle correct operation. The first write duty cycle correct operation may refer to an operation of correcting a duty cycle for the first clock signal and the third clock signal and correcting a duty cycle for the second clock signal and the fourth clock signal.

In an embodiment, a second write duty cycle correct operation may be performed after the read duty cycle correct operation is completed. That is, the memory device may perform the read duty cycle correct operation and then perform the second write duty cycle correct operation. The second write duty cycle correct operation may refer to an operation of correcting a duty cycle for the first clock signal and the second clock signal. For example, after the read duty cycle correct operation is completed, the second duty correction circuit 130 may perform the second write duty cycle correct operation to correct a duty cycle of the first clock signal and the second clock signal which have a phase difference of 90°, in response to a write duty cycle correct command signal received from the memory controller 200.

In other words, the memory device 100 may perform the read duty cycle correct operation and the first write duty cycle correct operation simultaneously. Afterwards, the memory device 100 may perform the second write duty cycle correct operation. In this regard, it is assumed that the second section is after the first section, and the third section is after the second section. For example, the memory device 100 may perform the read duty cycle correct operation during the first and second sections. The memory device 100 may perform the first write duty cycle correct operation during the first and second sections. The memory device 100 may correct a duty cycle for the first clock signal and the third clock signal in the first section. The memory device 100 may correct a duty cycle for the second clock signal and the fourth clock signal in the second section. The memory device 100 may perform the second write duty cycle correct operation in the third section. The memory device 100 may correct a duty cycle for the first clock signal having a phase of 0° and a duty cycle for the second clock signal having a phase of 90° in the third section.

As described above, the read duty cycle correct operation and the first write duty cycle correct operation may be performed simultaneously. Accordingly, the time and power required for the duty cycle correct training operation may be reduced.

Figure 12:
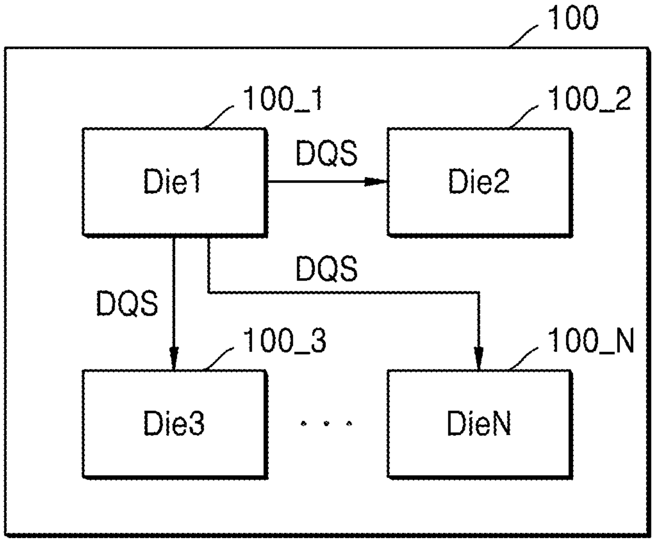
FIG. 12 is a block diagram illustrating a plurality of dies included in a memory device according to an embodiment.

FIG. 12 is a block diagram illustrating a plurality of dies included in a memory device according to an embodiment.

Referring to FIG. 12, the memory device 100 according to an embodiment may include a plurality of dies (100_1, 1002, 100_3, . . . , 100_N). A first die 100_1 in the memory device 100 according to an embodiment may generate the data strobe signal DQS and transmit the generated data strobe signal DQS to a second die 100_2, a third die 100_3, and an Nth die 100_N. That is, the memory device 100 may reduce time required for the write duty cycle correct operation for the entire memory device 100 by using the data strobe signal DQS generated by the first die 100_1 in the write duty cycle correct operation of the other dies (100_2, 100_3, . . . , 100_N).

Figure 13:
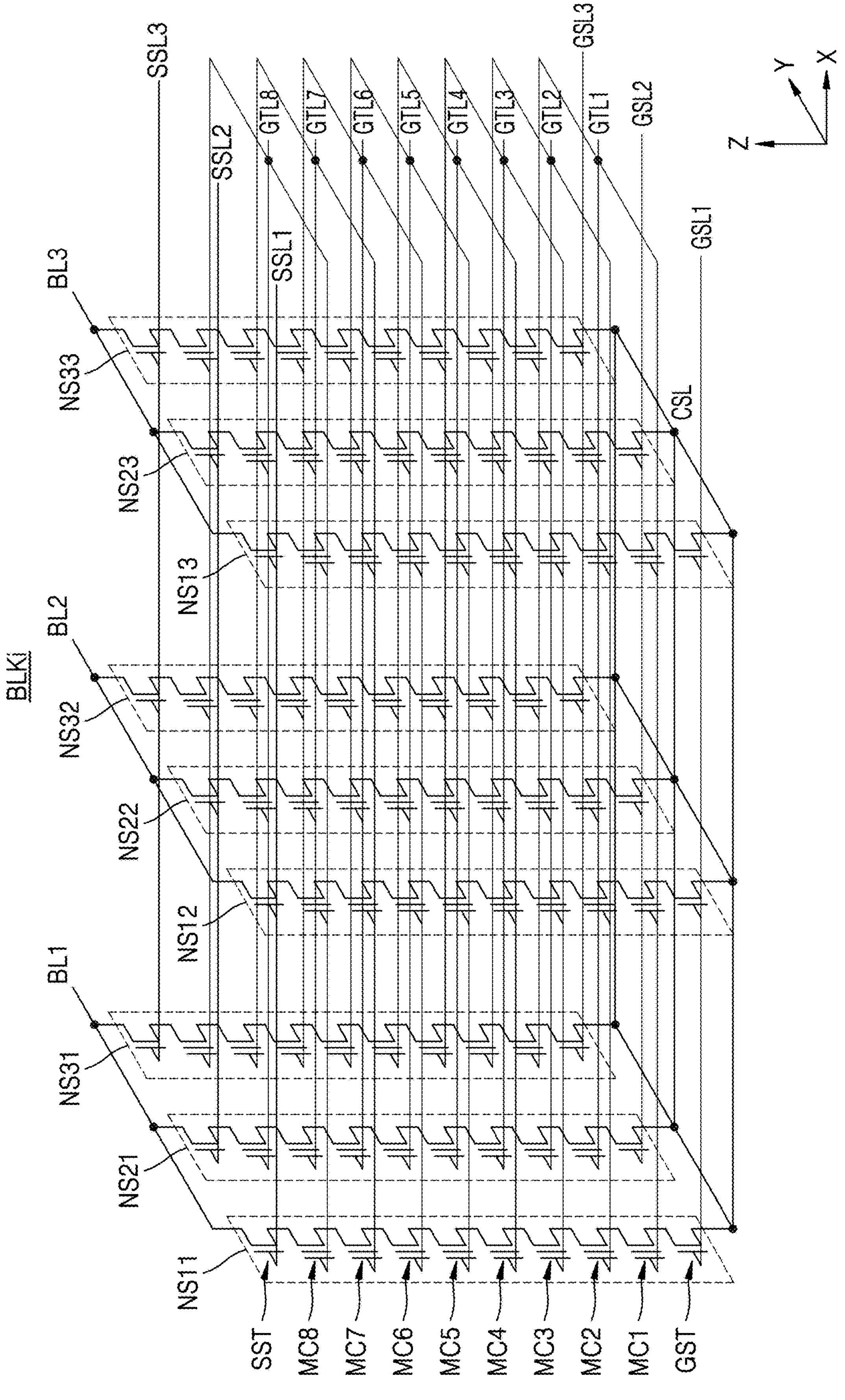
FIGS. 13 to 15 are diagrams that illustrate a three-dimensional (3D) V-NAND structure applicable to a memory device according to an embodiment.
Figure 14:
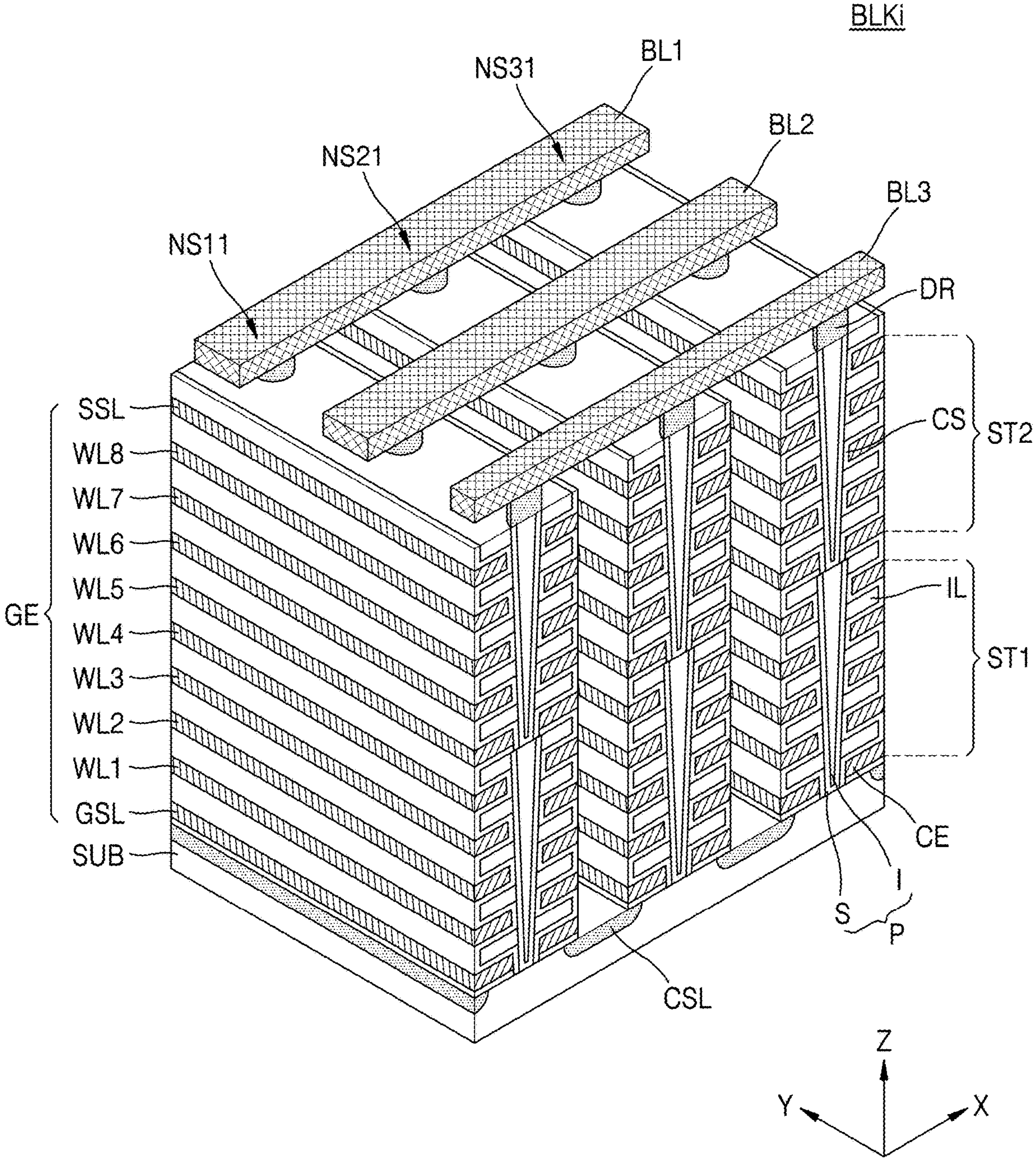
Figure 15:
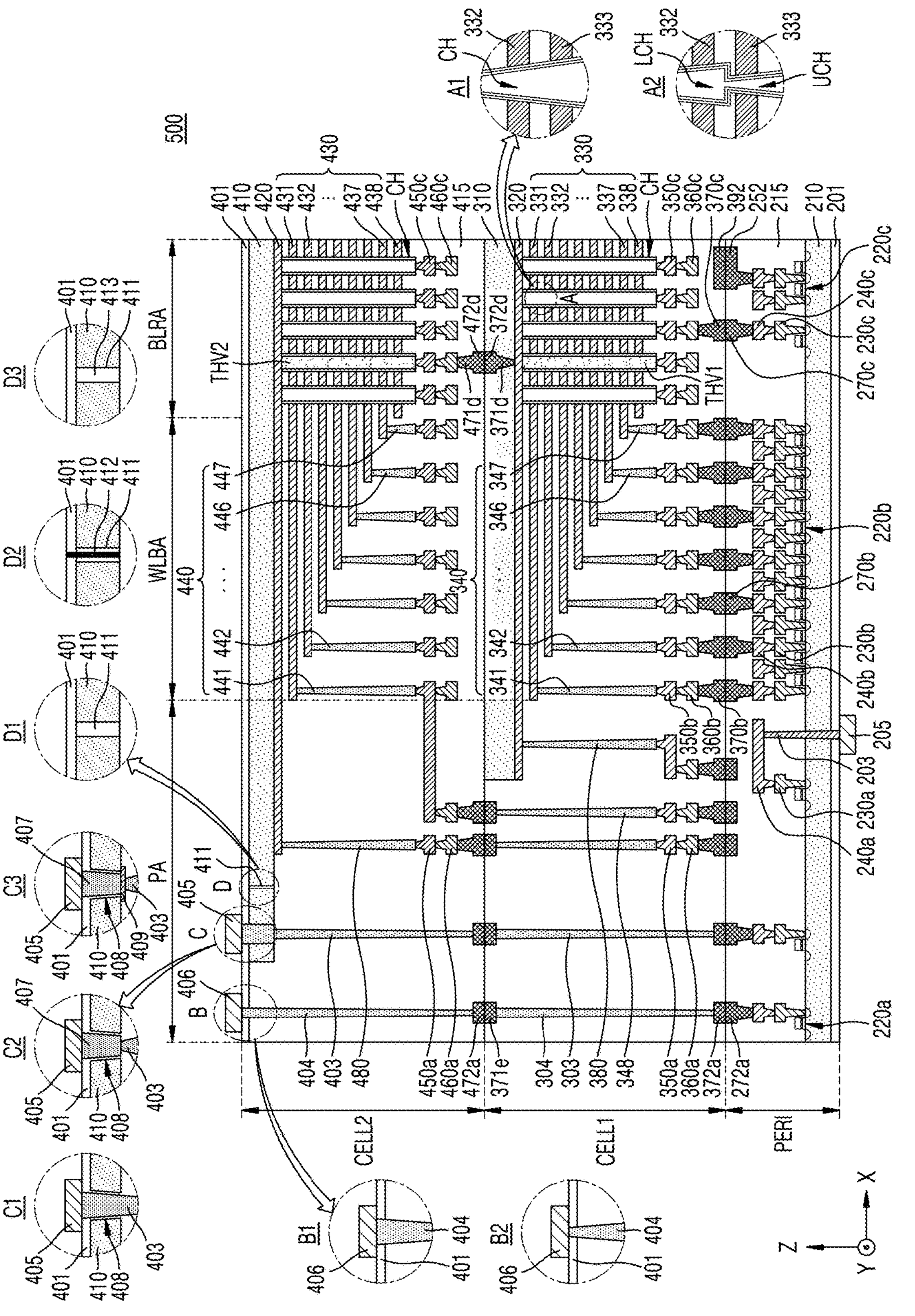

FIGS. 13 to 15 are diagrams that illustrate a three-dimensional (3D) V-NAND structure applicable to a memory device according to an embodiment.

A memory applicable to the memory device 100 of FIG. 1 may include a plurality of memory blocks. FIGS. 13 and 14 illustrate a structure of a memory block BLKi of a plurality of memory blocks, and FIG. 15 illustrates an embodiment of the memory device 100 of FIG. 1.

Referring to FIG. 13, the memory block BLKi may include a plurality of memory NAND strings (NS11 to NS33) connected between bit lines (BL1, BL2, and BL3) and a common source line CSL. Each of the plurality of memory NAND strings (NS11 to NS33) may include a string select transistor SST, a plurality of memory cells (MC1 to MC8), and a ground select transistor GST. For the sake of brevity of drawings, FIG. 10 illustrates that each of the plurality of memory NAND strings (NS11 to NS33) includes 8 memory cells (MC1 to MC8); however, embodiments of the inventive concept are not limited thereto.

The string select transistor SST may be connected to a corresponding string select line among string select lines (SSL1 to SSL3). Each of the plurality of memory cells (MC1 to MC8) may be respectively connected to corresponding gate lines (GTL1 to GTL8). The gate lines (GTL1 to GTL8) may correspond to word lines, and some of the gate lines (GTL1 to GTL8) may correspond to dummy word lines. The ground select transistor GST may be connected to a corresponding ground select line among string select lines (GSL1 to GSL3). The string select transistor SST may be connected to a corresponding bit line (BL1, BL2, or BL3), and the ground select transistor GST may be connected to the common source line CSL.

Gate lines having the same height (for example, GTL1) may be connected commonly, and the ground select lines (GSL1 to GSL3) and the string select lines (SSL1 to SSL3) may be respectively separated from each other. FIG. 13 illustrates that a memory block BLK is connected to 8 gate lines (GTL1 to GTL8) and 3 bine lines (BL1, BL2, and BL3); however, embodiments of the inventive concept are not limited thereto.

Referring to FIG. 14, the memory block BLKi may be formed in the vertical direction with respect to a substrate SUB. The memory cells constituting the memory NAND strings (NS11 to NS33) may be formed by being stacked on a plurality of semiconductor layers.

The common source line CSL extending in the first direction (Y direction) may be provided on the substrate SUB. On an area of the substrate SUB between two adjacent common source lines CSL, a plurality of insulating films IL extending in the first direction (Y direction) may be sequentially provided in the third direction (Z direction), and the plurality of insulating films IL may be spaced apart from each other at a certain distance in the third direction (Z direction). On an area of the substrate SUB between two adjacent common source lines CSL, a plurality of pillars P sequentially arranged in the first direction (Y direction) and passing through the plurality of insulating films IL in the third direction (Z direction) may be provided. The plurality of pillars P may pass through the plurality of insulating films IL and be in contact with the substrate SUB. A surface layer S of each pillar P may include a silicon material doped with the first conductivity type, and function as a channel region.

An internal layer I of each pillar P may include an insulator, such as a silicon oxide or an air gap. In an area between two adjacent common source lines CSL, a charge storage layer CS may be provided along the insulating layers IL, the pillars P and an exposed surface of the substrate SUB. The charge storage layer CS may include a gate insulating layer (or a "tunneling insulating layer"), a charge trap layer and a blocking insulating layer. Further, in the area between two adjacent common source lines CSL, gate electrodes GE such as the select lines (GSL and SSL) and the word lines (WL1 to WL8) may be provided on an exposed surface of the charge storage layer CS. A plurality of drains or drain contacts DR may be respectively provided on the plurality of pillars P. On the drain contacts DR, bit lines (BL1 to BL3) extending in the second direction (X direction) and spaced apart from each other at a certain distance in the first direction (Y direction) may be provided.

As illustrated in FIG. 13, each of the memory NAND strings (NS11 to NS33) may be implemented as a stacked structure of a first memory stack ST1 and second memory stack ST2. The first memory stack ST1 may be connected to the common source line CSL, the second memory stack ST2 may be connected to the bit lines (BL1 to BL3), and the first memory stack ST1 and the second memory stack ST2 may be stacked to share a channel hole.

FIG. 15 is a view illustrating a memory device 500 according to some embodiments of the inventive concepts.

Referring to FIG. 15, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in an example in which the bonding metal patterns are formed of copper (Cu), the bonding method may be a Cu—Cu bonding method. In other embodiments, the bonding metal patterns may be formed of aluminum (Al) or tungsten (W).

The memory device 500 may include the at least one upper chip including the cell region. For example, as illustrated in FIG. 15, the memory device 500 may include two upper chips. However, the number of the upper chips is not limited thereto. In the example in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 15. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the present embodiments. However, embodiments of the inventive concepts are not limited thereto. In certain embodiments, at least one or more additional metal lines may further be formed on the second metal lines 240*a*, 240*b* and 240*c*. In this example, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material, such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, and/or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate or extend through the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate or extend through the common source line 320 and lower word lines 331 and 332. The lower channel LCH may include a data storage layer, a channel layer, and a filling insulation layer and may be connected to the upper channel UCH. The upper channel UCH may penetrate or extend through upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the example in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this example, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated or extended into by the lower channel LCH is less than the number of the upper word lines 333 to 338 penetrated or extended into by the upper channel UCH in the region 'A2'. However, embodiments of the inventive concepts are not limited thereto. In certain embodiments, the number of the lower word lines penetrated or extended into by the lower channel LCH may be equal to or more than the number of the upper word lines penetrated or extended into by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 15, the first through-electrode THV1 may penetrate or extend through the common source line 320 and the plurality of word lines 330. In certain embodiments, the first through-electrode THV1 may further penetrate or extend through the second substrate 310. The first through-electrode THV1 may include a conductive material. Alternatively, the first through-electrode THV1 may include a conductive material at least partially surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 15, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material, such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 15, a lower insulating layer 201 may at least partially cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 at least partially covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate or extend through an interlayer insulating layer 415 of the second cell region CELL2 so as to be connected to the third input/output pad 406. In this example, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410 in the Z direction. For example, as illustrated in a region 'C', the second input/output contact plug 403 may penetrate or extend through the interlayer insulating layer 415 of the second cell region CELL2 in the third direction (e.g., the Z-axis direction) and may be electrically connected to the second input/output pad 405 through the third substrate 410. In this example, a connection structure of the second input/output contact plug 403 and the second input/output pad 405 may be realized by various methods.

In some embodiments, as illustrated in a region 'C1', an opening 408 may be formed to penetrate or extend through the third substrate 410, and the second input/output contact plug 403 may be connected directly to the second input/output pad 405 through the opening 408 formed in the third substrate 410. In this example, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating or extending through the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this example, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. In other embodiments, the second input/output pad 405 may be located between the slit 411 and the cell contact plugs 440 when viewed in a plan view.

In some embodiments, as illustrated in a region 'D1', the slit 411 may be formed to penetrate or extend through the third substrate 410. For example, the slit 411 may be used to reduce the likelihood of or prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this example, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

While the inventive concept has been particularly shown and described with reference to embodiments thereof, it will be understood that various changes in form and details may be made therein without departing from the spirit and scope of the following claims.

What is claimed is:

1. A memory device comprising:

a first pad configured to receive a read enable signal from a memory controller;

a second pad configured to receive a read duty cycle correct command signal from the memory controller;

a first duty correction circuit configured to perform a read duty cycle correct operation, based on the read duty cycle correct command signal received from the memory controller, when the read enable signal is received, and output a data strobe signal generated based on the read duty cycle correct operation; and a second duty correction circuit configured to receive the data strobe signal from the first duty correction circuit, generate first to fourth clock signals having different phases from each other based on the data strobe signal, and perform a write duty cycle correct operation to correct a duty cycle for the first clock signal and the third clock signal which have a phase difference of 180° and to correct a duty cycle for the second clock signal and the fourth clock signal which have a phase difference of 180°, wherein the read duty cycle correct operation and the write duty cycle correct operation are performed simultaneously.

2. The memory device of claim 1, wherein the second duty correction circuit comprises:

a first corrector configured to correct a duty cycle of the first clock signal and the third clock signal;

a second corrector configured to correct a duty cycle of the second clock signal and the fourth clock signal; and a divider configured to generate the first to fourth clock signals based on the data strobe signal.

3. The memory device of claim 2, further comprising a third pad configured to output the data strobe signal received from the first duty correction circuit to the memory controller, wherein the second duty correction circuit is configured to receive the data strobe signal from the third pad.

4. The memory device of claim 2, further comprising a switch connected between the first duty correction circuit and the second duty correction circuit, wherein the second duty correction circuit is configured to receive the data strobe signal from the first duty correction circuit when the switch is turned on.

5. The memory device of claim 2, wherein the first duty correction circuit is configured to perform the read duty cycle correct operation during a first section and a second section, and the second duty correction circuit is configured to correct a duty cycle for the first clock signal and the third clock signal in the first section and correct a duty cycle for the second clock signal and the fourth clock signal in the second section.

6. The memory device of claim 1, wherein the first clock signal has a phase of 0°, the second clock signal has a phase of 90°, the third clock signal has a phase of 180°, and the fourth clock signal has a phase of 270°.

7. The memory device of claim 1, further comprising a plurality of dies each including the first duty correction circuit and the second duty correction circuit, wherein the second duty correction circuit included in each of the plurality of dies is configured to receive as an input a data strobe signal output from the first duty correction circuit of at least one of the plurality of dies.

8. The memory device of claim 1, wherein the write duty cycle correct operation is a first write duty cycle correct operation, and after the read duty cycle correct operation is completed, the second duty correction circuit is configured to perform a second write duty cycle correct operation to correct a duty cycle for the first clock signal and the second clock signal which have a phase difference of 90°, in response to a write duty cycle correct command signal received from the memory controller.

9. An operating method of a memory device, the operating method comprising:

receiving a read duty cycle correct command and a read enable signal from a memory controller;

when the read enable signal is received, performing a read duty cycle correct operation, based on the read duty cycle correct command, and outputting a data strobe signal, based on the read duty cycle correct operation;

receiving the data strobe signal and generating first to fourth clock signals having different phases from each other based on the data strobe signal; and performing a write duty cycle correct operation to correct a duty cycle for the first to fourth clock signals, wherein the read duty cycle correct operation and the write duty cycle correct operation are performed simultaneously.

10. The operating method of claim 9, wherein the performing of the write duty cycle correct operation comprises:

correcting a duty cycle for the first clock signal and the third clock signal which have a phase difference of 180°; and correcting a duty cycle for the second clock signal and the fourth clock signal which have a phase difference of 180°.

11. The operating method of claim 9, wherein the first clock signal has a phase of 0°, the second clock signal has a phase of 90°, the third clock signal has a phase of 180°, and the fourth clock signal has a phase of 270°.

12. The operating method of claim 9, wherein the write duty cycle correct operation is a first write duty cycle correct operation, and the operating method further comprises, after the read duty cycle correct operation is completed, performing a second write duty cycle correct operation to correct a duty cycle for the first clock signal and the second clock signal which have a phase difference of 90°, in response to a write duty cycle correct command signal received from the memory controller.

13. A memory system comprising:

a memory controller configured to generate a read duty cycle correct command and a read enable signal; and a memory device configured to perform a training operation with respect to a read signal and a write signal, wherein the memory device comprises:

a first pad configured to receive the read enable signal from the memory controller;

a second pad configured to receive the read duty cycle correct command signal;

a first duty correction circuit configured to perform a read duty cycle correct operation, based on the read duty cycle correct command signal received from the memory controller, when the read enable signal is received, and output a data strobe signal, based on the read duty cycle correct operation; and a second duty correction circuit configured to receive the data strobe signal from the first duty correction circuit, generate first to fourth clock signals having different phases from each other based on the data strobe signal, and perform a write duty cycle correct operation to correct a duty cycle for the first to fourth clock signals, wherein the read duty cycle correct operation and the write duty cycle correct operation are performed simultaneously.

14. The memory system of claim 13, wherein the second duty correction circuit comprises:

a first corrector configured to correct a duty cycle of the first clock signal and the third clock signal;

a second corrector configured to correct a duty cycle of the second clock signal and the fourth clock signal; and a divider configured to generate the first to fourth clock signals based on the data strobe signal.

15. The memory system of claim 13, further comprising a third pad configured to output the data strobe signal received from the first duty correction circuit to the memory controller, wherein the second duty correction circuit is configured to receive the data strobe signal from the third pad.

16. The memory system of claim 13, further comprising a switch connected between the first duty correction circuit and the second duty correction circuit, wherein the second duty correction circuit is configured to receive the data strobe signal from the first duty correction circuit when the switch is turned on.

17. The memory system of claim 13, wherein the first duty correction circuit is configured to perform the read duty cycle correct operation during a first section and a second section, and the second duty correction circuit is configured to correct a duty cycle for the first clock signal and the third clock signal in the first section and correct a duty cycle for the second clock signal and the fourth clock signal in the second section.

18. The memory system of claim 13, wherein the first clock signal has a phase of 0°, the second clock signal has a phase of 90°, the third clock signal has a phase of 180°, and the fourth clock signal has a phase of 270°.

19. The memory system of claim 13, further comprising a plurality of dies each including the first duty correction circuit and the second duty correction circuit, wherein the second duty correction circuit included in each of the plurality of dies is configured to receive as an input a data strobe signal output from the first duty correction circuit of at least one of the plurality of dies.

20. The memory system of claim 13, wherein the write duty cycle correct operation is a first write duty cycle correct operation, and after the read duty cycle correct operation is completed, the second duty correction circuit is configured to perform a second write duty cycle correct operation to correct a duty cycle for the first clock signal and the second clock signal which have a phase difference of 90°, in response to a write duty cycle correct command signal received from the memory controller.

* * * * *